(12) United States Patent
Joo

(10) Patent No.: US 6,728,151 B2
(45) Date of Patent: Apr. 27, 2004

(54) DRIVING A DRAM SENSE AMPLIFIER HAVING LOW THRESHOLD VOLTAGE PMOS TRANSISTORS

(75) Inventor: Yangsung Joo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/233,997

(22) Filed: Aug. 29, 2002

(65) Prior Publication Data
US 2004/0042305 A1 Mar. 4, 2004

(51) Int. Cl.[7] .................................................. G11C 7/00
(52) U.S. Cl. .................. 365/205; 365/189.09; 365/222; 365/226
(58) Field of Search ................................ 365/205, 226, 365/222, 189.09

(56) References Cited

U.S. PATENT DOCUMENTS

| 5,602,785 | A | 2/1997 | Casper | 365/189.11 |
|---|---|---|---|---|
| 5,627,785 | A | 5/1997 | Gilliam et al. | 365/189.01 |
| 5,768,202 | A | 6/1998 | Raad | 365/207 |
| 5,898,639 | A | 4/1999 | Blodgett | 365/230.06 |
| 6,049,496 | A | 4/2000 | Forbes et al. | 365/208 |
| 6,058,058 | A | 5/2000 | Gilliam et al. | 365/207 |
| 6,078,538 | A | 6/2000 | Ma et al. | 365/226 |
| 6,172,924 | B1 | 1/2001 | Gilliam et al. | 365/207 |
| 6,198,681 | B1 | 3/2001 | Forbes | 365/205 |
| 6,235,569 | B1 | 5/2001 | Noble et al. | 438/234 |
| RE37,593 | E | * 3/2002 | Etoh et al. | 365/189.09 |
| 6,434,072 | B2 | 8/2002 | Mullarkey et al. | 365/207 |
| 6,466,499 | B1 | 10/2002 | Blodgett | 365/207 |
| 6,522,592 | B2 | * 2/2003 | Van De Graaff | 365/205 |

* cited by examiner

Primary Examiner—Michael S. Lebentritt
Assistant Examiner—Pho M. Luu
(74) Attorney, Agent, or Firm—Fish & Neave; Garry J. Tuma; Peter F. Snell

(57) ABSTRACT

Circuits and methods for driving a DRAM sense amplifier having low threshold voltage PMOS transistors are described. The source terminal of a low $V_{tp}$ PMOS transistor is maintained at ground potential during DRAM standby mode. The source terminal of the low $V_{tp}$ PMOS transistor is raised to an intermediate supply voltage responsive to a transition from DRAM standby mode to either DRAM read mode, write mode, or refresh mode and prior to development of a differential voltage between the gate and drain terminals of the low $V_{tp}$ PMOS transistor. These circuits and methods advantageously limit current loss through the low $V_{tp}$ PMOS transistor when the differential voltage develops between the gate and drain terminals of that low $V_{tp}$ PMOS transistor and in the event of a word line and digital line short-circuit.

57 Claims, 12 Drawing Sheets

DRIVING A DRAM SENSE AMPLIFIER HAVING LOW THRESHOLD VOLTAGE PMOS TRANSISTORS

BACKGROUND OF THE INVENTION

This invention relates to circuits and methods for driving a dynamic random access memory (DRAM) sense amplifier. More particularly, this invention relates to circuits and methods for driving a DRAM sense amplifier having low threshold voltage p-channel metal-oxide semiconductor (PMOS) field-effect transistors.

Known DRAM circuits generally include the following: a plurality of dynamic memory cells each operative to store digital data (i.e., digital data bit "1" or digital data bit "0"); word lines operative to "select" and "deselect" the memory cells; and digital lines operative to read, write, and refresh the digital data of selected memory cells. Additionally, DRAM circuits include sense amplifier circuitry, sense amplifier driver circuitry, and various other peripheral circuitry (e.g., equalization and pre-charge circuitry, write circuitry, word line decoders, digital line decoders, etc.) that control DRAM operation.

Generally speaking, DRAM sense amplifier driver circuitry "activates" a sense amplifier during read, write, and refresh operations. An activated sense amplifier amplifies (i.e., increases) a differential voltage between a complimentary pair of digital lines to a full digital logic separation (i.e., a full digital "0" on the first digital line of the complimentary pair and a full digital "1" on the second digital line of the complimentary pair). Alternatively, DRAM sense amplifier driver circuitry "deactivates" the sense amplifier during DRAM standby mode (i.e., DRAM circuit operation pending a read, write, or refresh operation). A deactivated sense amplifier does not amplify and preferably does not affect the voltage potential between the complimentary pair of digital lines.

As feature size (e.g., transistor channel length) is reduced, an increased number of transistors can be included in an integrated circuit (IC) chip. For DRAM technology, an increased number of transistors can advantageously provide, for example, increased data storage capacity in a DRAM circuit (i.e., additional memory cells). However, because the number of transistors on an IC chip is directly proportional to power consumption by the IC chip, any significant increase in the number of transistors on an IC chip is preferably accompanied by a reduction in the voltage supplied to the IC chip, which reduces power consumption by the IC chip. Such a voltage reduction is generally accompanied by a decrease in the threshold voltage of each transistor (i.e., voltage at which a transistor becomes conductive or turns "ON").

Known DRAM sense amplifier driver circuits are not well-suited for driving DRAM sense amplifiers having low threshold voltage PMOS transistors. Such known driver circuits cause significant sub-threshold current loss through sense amplifiers having low threshold voltage PMOS transistors. Sub-threshold current loss through a DRAM sense amplifier undesirably increases power consumption, increases the time required for a read, write, and refresh operation, and can cause erroneous reading and refreshing of digital data.

In view of the foregoing, it would be desirable to provide improved circuits and methods for driving a DRAM sense amplifier having low threshold voltage PMOS transistors.

SUMMARY OF THE INVENTION

It is an object of the invention to provide improved circuits and methods for driving a DRAM sense amplifier having low threshold voltage PMOS transistors.

Improved electrical circuits for driving a DRAM sense amplifier having low threshold voltage ($V_{tp}$) PMOS transistors are provided in accordance with the invention. Electrical circuitry is provided that maintains the source terminal of a PMOS transistor of a DRAM sense amplifier at ground potential during DRAM standby mode. In one embodiment, the electrical circuitry pulls-down the source terminal of the PMOS transistor to ground potential in response to an EQ line transition to digital "1." In another embodiment, the electrical circuitry pulls-down the source terminal of the PMOS transistor to ground potential in response to both an EQ line transition to digital "1" and a /WLEN line transition to digital "1." In still another embodiment, the electrical circuitry pulls-down the source terminal of the PMOS transistor to ground potential in response to both a /PSA line transition to digital "1" and a /WLEN line transition to digital "1." Maintaining the source terminal of the PMOS transistor at ground potential during DRAM standby mode limits current bleed through the PMOS transistor in the event of a word line and digital line short-circuit.

Electrical circuitry is also provided that raises the source terminal of the PMOS transistor to an intermediate supply voltage in response to a transition from DRAM standby mode to either DRAM read mode, DRAM write mode, or DRAM refresh mode and prior to development of a differential voltage between the gate and drain terminals of the PMOS transistor. In one embodiment, the electrical circuitry raises the source terminal of the PMOS transistor to the intermediate voltage in response to an EQ line transition to digital "0." In another embodiment, the electrical circuitry raises the source terminal of the PMOS transistor to the intermediate voltage in response to a /WLEN line transition to digital "0." Raising the source terminal to an intermediate voltage limits current loss through the PMOS transistor when a differential voltage develops between the gate and drain terminals of the PMOS transistor.

Electrical circuitry is also provided that raises the source terminal of the PMOS transistor to a full supply voltage after a differential voltage develops between the gate and drain terminals of the PMOS transistor. In one embodiment, the electrical circuitry raises the source terminal of the PMOS transistor to a full supply voltage in response to a /PSA line transition to digital "0."

The electrical circuits of the invention activate a sense amplifier in less time and cause the sense amplifier to amplify a differential voltage between the gate and drain terminals of the PMOS transistor to a full digital logic separation in less time. Additionally, the electrical circuits of the invention result in more efficient power consumption by the sense amplifier.

Improved methods for driving a DRAM sense amplifier having low threshold voltage PMOS transistors are also provided in accordance with the invention.

DRAM circuits including sense amplifier driver circuitry of the invention and systems that incorporate the invention are further provided.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

This invention relates to circuits and methods for driving a DRAM sense amplifier having low threshold voltage ($V_{tp}$) PMOS transistors.

Figure 1:
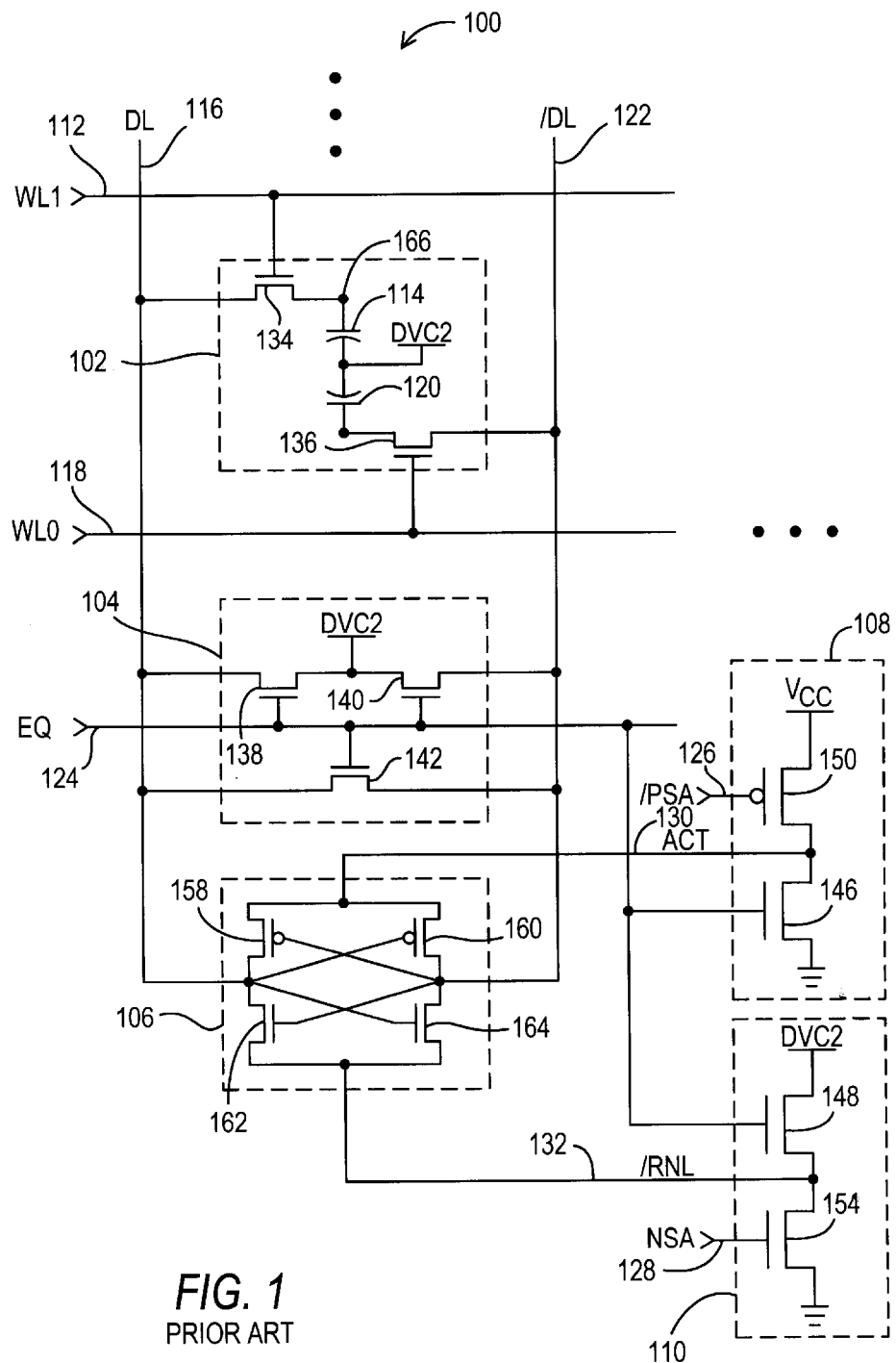
FIG. 1 is a circuit diagram of a known DRAM circuit that includes known DRAM sense amplifier driver circuitry.

FIG. 1 shows a known DRAM circuit 100. DRAM circuit 100 includes DRAM cells 102, digital line equalization and pre-charge circuitry 104, sense amplifier 106, and sense amplifier driver circuitries 108 and 110. Note that a DRAM circuit generally includes multiple DRAM cells 102 and various additional peripheral circuitry (e.g., write circuitry, word line decoders, digital line decoders, additional equalization and pre-charge circuitry, additional sense amplifier circuitry, etc.). However, for purposes of clarity and brevity, additional DRAM cells and peripheral circuitry are not shown or described herein.

In general, DRAM circuit 100 performs reads, writes, and periodic refreshes of digital data (i.e., digital data bit "1" or digital data bit "0") in DRAM cells 102. In particular, following activation of word line WL1 112 (e.g., raising WL1 112 to a digital "1"), a digital data bit of capacitor 114 can be read, overwritten, or refreshed via digital line DL 116. Similarly, following activation of word line WL0 118, a digital data bit of capacitor 120 can be read, overwritten, or refreshed via digital line /DL 122.

Figure 2:
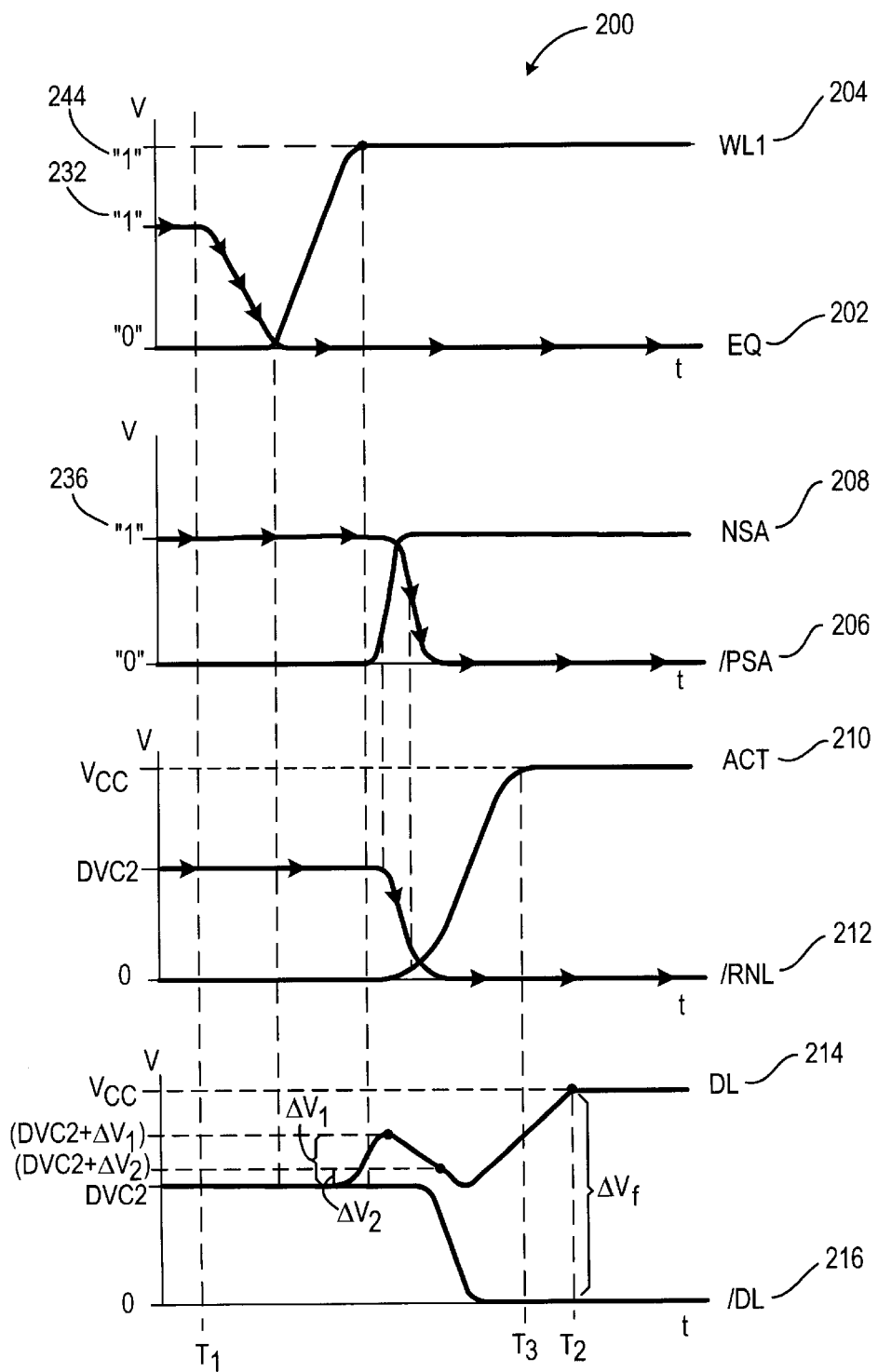
FIG. 2 shows voltage versus time graphs for various control signals and node voltages of a known DRAM circuit for a transition from DRAM standby mode to either DRAM read, write, or refresh mode.

FIG. 2 shows voltage versus time graphs 200 for various control signals and resulting node voltages for a transition in DRAM circuit 100 from DRAM standby mode to either DRAM read, write, or refresh mode. In particular, referring to both FIGS. 1 and 2, control signal EQ 202 is input to EQ line 124, control signal WL1 204 is input to word line WL1 112, control signal /PSA 206 is input to /PSA line 126, and control signal NSA 208 is input to NSA line 128 for a transition from standby mode to read, write, or refresh mode. Additionally, signal ACT 210 is output to ACT line 130, signal /RNL 212 is output to /RNL line 132, and voltage signals (214, 216) result at complimentary digital lines DL 116 and /DL 122 for that transition. The time axis of each of graphs 200 extends from about time $T_1$ where DRAM standby mode ends and a DRAM read, write, or refresh mode begins, to about time $T_2$ where a full digital logic (voltage) separation $\Delta V_f$ develops between digital lines DL 116 and /DL 122 of known DRAM circuit 100. From about time $T_1$ to about time $T_2$, or even somewhat before time $T_2$ (e.g., at or before time $T_3$ where ACT line 210 reaches voltage $V_{CC}$) DRAM circuit 100 operates similarly, if not identically, for read, write, and refresh mode. Operation of DRAM circuit 100 after time $T_2$ or somewhat before time $T_2$ (e.g., at or before time $T_3$) determines whether a DRAM read, write, or refresh operation is performed.

Voltage versus time graphs 200 show signal transitions of known DRAM circuit 100 for a DRAM read, write, or refresh of the data bit of capacitor 114. Word line control signal WL1 204 holds word line WL1 112 constant at digital "0" (e.g., ground potential) during DRAM standby mode, which ends at time $T_1$. The control signal for word line WL0 118 holds WL0 118 constant at digital "0" from time $T_1$ to time $T_2$ and is not shown in FIG. 2 for clarity. During standby mode, digital "0" word line WL1 112 maintains NMOS transistor 134 in the "OFF" state, and digital "0" word line WL0 118 maintains NMOS transistor 136 in the "OFF" state. Therefore, neglecting leakage current, no charging or discharging of capacitors 114 and 120 of RAM cells 102 occurs during DRAM standby mode.

Control signal EQ 202 holds EQ line 124 constant at digital "1" 232 during DRAM standby mode. Digital "1" EQ line 124 maintains NMOS transistors 138, 140, and 142 of equalization and pre-charge circuitry 104 in the "ON" state during standby mode. "ON" transistors 138 and 140 pre-charge digital lines DL 116 and /DL 122 to voltage DVC2. "ON" transistor 142 equalizes (i.e., eliminates differential voltage between) digital lines DL 116 and /DL 122.

Digital "1" EQ line 124 also maintains both NMOS transistor 146 of sense amplifier driver circuitry 108 and NMOS transistor 148 of sense amplifier driver circuitry 110 in the "ON" state during standby mode. Additionally, because control signal /PSA 206 holds /PSA line 126 at digital "1" 236 during DRAM standby mode (which maintains PMOS transistor 150 of sense amplifier driver circuitry 108 in the "OFF" state), "ON" transistor 146 "pulls-down" ACT output signal 210 at ACT line 130 to ground (i.e., about 0 volts) during standby mode. Because control signal NSA 208 holds NSA line 128 at digital "0" during standby mode (which maintains NMOS transistor 154 of sense amplifier driver circuitry 110 in the "OFF" state), "ON" transistor 148 "pushes-up" output signal /RNL 212 at /RNL line 132 to voltage DVC2 during standby mode. Supply voltage DVC2 is generally about one-half of supply voltage $V_{CC}$.

Sense amplifier 106 is "deactivated" (i.e., not amplifying) during standby mode. As shown, sense amplifier 106 is a latch formed by cross-coupling two complimentary metal oxide semiconductor (CMOS) inverters implemented with PMOS transistors 158 and 160 and NMOS transistors 162 and 164. In particular, because ACT line 130 is pulled-down to ground and because both digital lines DL 116 and /DL 122 are maintained at voltage DVC2 during standby mode, as previously described, both the source to gate voltage ($V_{SGP}$) and the drain to gate voltage ($V_{DGP}$) are less than the absolute value of the threshold voltage ($|V_{tp}|$) for each of PMOS transistors 158 and 160 of sense amplifier 106, and thus transistors 158 and 160 are "OFF." Additionally, because /RNL line 132 is maintained at voltage DVC2 and because both digital lines DL 116 and /DL 122 are maintained at voltage DVC2 during standby mode, as previously described, both the gate to source voltage ($V_{GSN}$) and the gate to drain voltage ($V_{GDN}$) are less than the threshold voltage ($V_{tn}$) for each of NMOS transistors 162 and 164 of sense amplifier 106, and thus transistors 162 and 164 are "OFF." Therefore, because each of transistors 158, 160, 162, and 164 of sense amplifier 106 is "OFF" during standby mode, sense amplifier 106 does not amplify or otherwise affect the voltage potential between digital lines DL 116 and /DL 122 during standby mode.

Sense amplifier driver circuitry 108 is a "bleeder sense amplifier driver" circuit that limits current "bleed" (i.e., loss) through sense amplifier 106 in the event of a short-circuit between a word line and a digital line of DRAM circuit 100. A short-circuit between a word line and a digital line ruins the integrity (i.e., usability) of each DRAM storage capacitor connected (via a transistor) to at least one of the short-circuited word line and digital line. Such a short-circuit generally becomes more likely as the density and complexity of a DRAM circuit increases. In particular, for a short-circuit between, for example, word line WL1 112 and digital line DL 116, WL1 112 fights to pull-down digital line DL 116 to ground (i.e., control signal WL1 204 holds word line WL1 112 constant at ground because the DRAM memory cells connected to WL1 112 can no longer be used). However, because sense amplifier driver circuitry 108 maintains ACT line 130 at ground during standby mode, the drain and source terminals of PMOS transistor 158 of sense amplifier 106 are at about equal voltage potential during standby mode, thus limiting the short-circuit "bleed" current that flows through transistor 158.

Returning to FIGS. 1 and 2, DRAM standby mode ends and either DRAM read, write, or refresh mode begins when EQ control signal 202 switches from digital "1" 232 to digital "0." Digital "0" EQ line 124 turns "OFF" transistors 138, 140, and 142 of equalization and pre-charge circuitry 104. However, because the control signal for word line WL0 118 remains at digital non (which keeps DRAM transistor 136 "OFF") and because control signal WL1 204 remains at digital "0" (which keeps DRAM transistor 134 "OFF"), digital lines DL 116 and /DL 122 remain at about voltage DVC2. Digital "0" EQ line 124 also turns "OFF" transistor 146 of sense amplifier driver circuitry 108. However, because /PSA control signal 206 remains at digital "1" 236 (which keeps transistor 150 "OFF"), ACT line 130 remains at about ground. Furthermore, digital "0" EQ line 124 turns "OFF" transistor 148 of sense amplifier driver circuitry 110. However, because control signal NSA 208 remains at digital "0" (which keeps transistor 154 "OFF"), /RNL line 132 remains at about voltage DVC2. Therefore, because the voltage potentials of each of digital lines DL 116 and /DL 122, /RNL line 132, and ACT line 130 remain virtually unchanged by the EQ line 124 transition to digital "0," each of transistors 158, 160, 162, and 164 of sense amplifier 106 remains "OFF" and sense amplifier 106 does not amplify or otherwise affect the voltage potential between digital lines DL 116 and /DL 122.

At about the same time that EQ control signal 202 completes the transition to digital "0," word line control signal WL1 204 begins switching from digital "0" to digital "1" 244. As shown, digital "1" 244 for word line WL1 112 (and equivalently digital "1" for word line WL0 118) corresponds to a generally higher voltage than digital "1" 232 for EQ control signal 202. Digital "1" word line WL1 112 turns "ON" DRAM access transistor 134. "ON" transistor 134 provides a current path between capacitor 114 and digital line DL 116. When capacitor 114 stores a digital "0" data bit (i.e., node 166 is at about ground), current flows from digital line DL 116 (which is charged to about voltage DVC2) to node 166, thus discharging digital line DL 116 to a voltage slightly less than voltage DVC2. When capacitor 114 stores a digital "1" data bit (i.e., node 166 is at about voltage $V_{CC}$) current flows from node 166 to digital line DL 116, thus charging digital line DL 116 to a voltage slightly greater than voltage DVC2. For purposes of clarity and brevity, only the storage of a digital "1" data bit in capacitor 114 is described herein.

When capacitor 114 stores a digital "1" data bit, current flows through "ON" transistor 134 from node 166 to digital line DL 116, thus charging digital line DL 116 to voltage (DVC2+$\Delta V_1$). Because the voltage of digital line /DL 122 remains at about voltage DVC2, a differential voltage equal to about $\Delta V_1$ (e.g., 0.2–0.3 volts) develops between complimentary digital lines DL 116 and /DL 122. At this point, sense amplifier 106 remains "deactivated" (i.e., not amplifying) because ACT line 130 remains at about ground and /RNL line 132 remains at about voltage DVC2. However, because PMOS transistor 158 has a low threshold voltage (e.g., a $|V_{tp}|$ slightly greater than differential voltage $\Delta V_1$), differential voltage $\Delta V_1$ (which is $V_{DGP}$ of PMOS transistor 158) turns PMOS transistor 158 "sub-threshold ON." Sub-threshold operation of a PMOS transistor provides a current path between the drain and source terminals of the PMOS transistor and occurs when $V_{DGP}$ or $V_{SGP}$ is raised to slightly less than $|V_{tp}|$ of the PMOS transistor. Therefore, because digital line DL 116 is at voltage (DVC2+$\Delta V_1$) and because ACT line 130 is at about ground, current flows through "sub-threshold ON" PMOS transistor 158 from digital line DL 116 to ACT line 130, thus undesirably discharging digital line DL 116 to voltage (DVC2+$\Delta V_2$). As shown, sub-threshold current loss through low $V_{tp}$ PMOS transistor 158 causes the differential voltage of about $\Delta V_1$ between complimentary digital lines DL 116 and /DL 122 to be undesirably reduced to a differential voltage of about $\Delta V_2$.

Sense amplifier 106 is fully activated (i.e., amplifying) at time $T_3$. In particular, control signal NSA 208 switches from digital "0" to digital "1" 236, thus turning "ON" transistor 154 of sense amplifier driver circuitry 110. "ON" transistor 154 pulls-down /RNL line 132 to ground. Additionally, control signal /PSA 206 switches from digital "1" 236 to digital "0," thus turning "ON" transistor 150 of sense amplifier driver circuitry 108. "ON" transistor 150 pulls-up ACT line 130 to voltage $V_{CC}$. Known sense amplifier driver circuitry 108 and 110 operate in an "n-sensing" configuration in which NSA line 128 switches to digital "1" 236 slightly before (e.g., about 50 picoseconds before) /PSA line 126 switches to digital "0" (which causes /RNL line 132 to begin to switch to ground slightly before ACT line 130 begins to switch to voltage $V_{CC}$) Each of transistors 158, 160, 162, and 164 of sense amplifier 106 turns "ON," thus causing sense amplifier 106 to amplify a differential voltage between complimentary digital lines DL 116 and /DL 122 to a full digital logic separation. If the sub-threshold current loss through a low $V_{tp}$ PMOS transistor 158 causes the voltage of digital line DL 116 to be significantly reduced, sense amplifier 106 may incorrectly amplify the voltage of digital line DL 116 to full digital "0" and the voltage of digital line /DL 122 to full digital "1" (which can cause an erroneous DRAM read or refresh operation).

FIG. 2 shows the correct amplification to full digital logic separation $\Delta V_f$ by sense amplifier 106 of reduced differential voltage $\Delta V_2$ between complimentary digital lines DL 116 and /DL 122 for either a DRAM read, write, or refresh operation. In particular, sense amplifier 106 increases the voltage of digital line DL 116 to voltage $V_{CC}$ and decreases the voltage of digital line /DL 122 to ground. However, in amplifying differential voltage $\Delta V_2$ between complimentary digital lines DL 116 and /DL 122 to full digital logic separation $\Delta V_f$, sense amplifier 106 inefficiently consumes power and requires additional time to recover the significant differential voltage lost (i.e., about ($\Delta V_1 - \Delta V_2$)) because of sub-threshold current conduction by a low $V_{tp}$ PMOS transistor 158.

Figure 3:
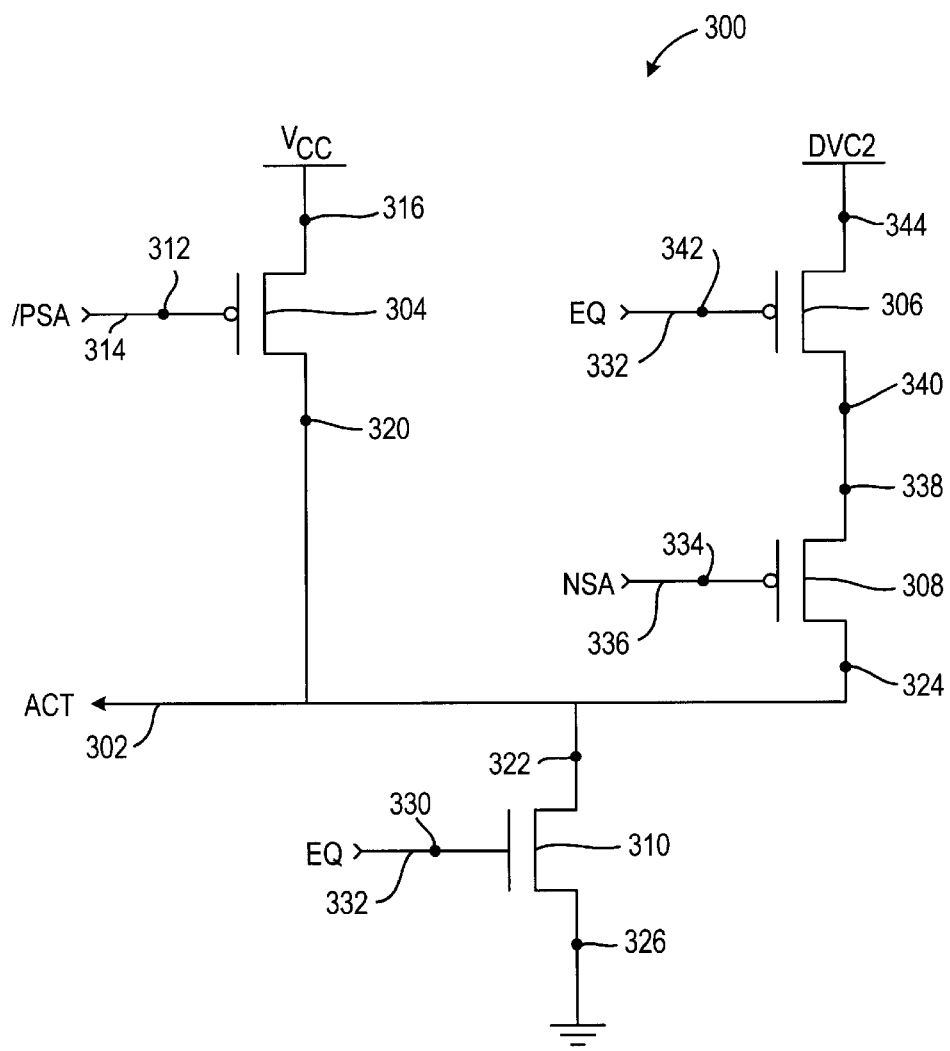
FIG. 3 is a circuit diagram of an exemplary embodiment of an n-sensing sense amplifier driver circuit in accordance with the invention.

FIG. 3 shows an exemplary embodiment of an improved n-sensing sense amplifier driver circuit 300 that outputs an ACT voltage to ACT line 302 in accordance with the invention. N-sensing sense amplifier driver circuit 300 desirably maintains a "bleeder" circuit configuration (i.e., maintains ACT line 302 at ground during DRAM standby mode) and advantageously limits sub-threshold current loss through a sense amplifier having low $V_{tp}$ PMOS transistors.

N-sensing sense amplifier driver circuit 300 includes PMOS transistors 304, 306, and 308 and NMOS transistor 310. Gate terminal 312 of transistor 304 is connected to /PSA line 314 (to which a /PSA control signal is input). Source terminal 316 of transistor 304 is connected to supply voltage $V_{CC}$. Drain terminal 320 of transistor 304 is connected to both drain terminal 322 of transistor 310 and drain terminal 324 of transistor 308 at ACT line 302 (to which an ACT signal is output). Source terminal 326 of transistor 310 is connected to ground. Gate terminal 330 of transistor 310 is connected to EQ line 332 (to which an EQ control signal is input). Gate terminal 334 of transistor 308 is connected to NSA line 336 (to which an NSA control signal is input). Source terminal 338 of transistor 308 is connected to drain terminal 340 of transistor 306. Gate terminal 342 of transistor 306 is connected to EQ line 332. Source terminal 344 of transistor 306 is connected to supply voltage DVC2. As used herein, the term "connected" refers to a direct electrical connection between two circuit elements (i.e., no intervening elements), while the term "coupled" refers to an electrical connection between two circuit elements that may have an intervening circuit element between them.

Referring to both FIGS. 1 and 3, operation of n-sensing sense amplifier driver circuit 300 will be described herein in connection with various portions of known DRAM circuit 100. In particular, n-sensing sense amplifier driver circuit 300 replaces sense amplifier driver circuitry 108 of known DRAM circuit 100. Accordingly, ACT line 302 corresponds to ACT line 130, /PSA line 314 corresponds to /PSA line 126, EQ line 332 corresponds to EQ line 124, and NSA line 336 corresponds to NSA line 128. However, n-sensing sense amplifier driver circuit 300 may be used with any suitable DRAM circuitry and is not limited to use with the various portions of known DRAM circuit 100 described herein.

Figure 4:
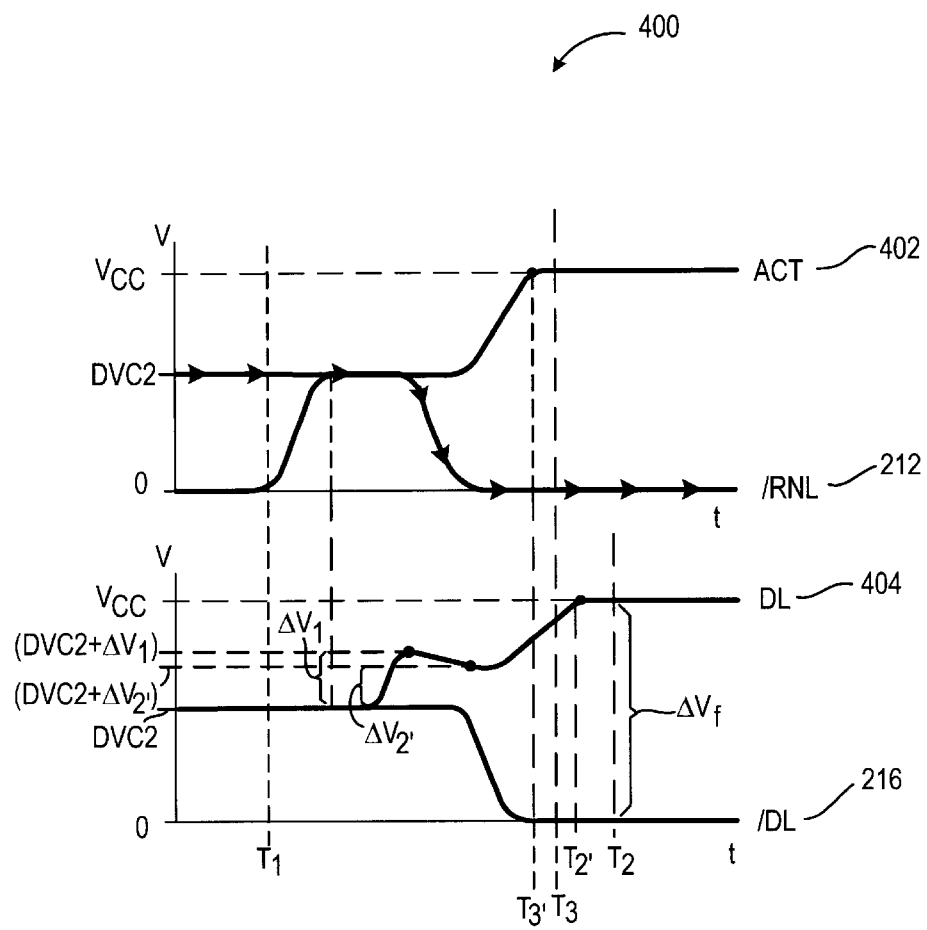
FIG. 4 shows voltage versus time graphs for various node voltages for a transition from DRAM standby mode to either DRAM read, write, or refresh mode using the circuitry of FIG. 3.

FIG. 4 shows voltage versus time graphs for various voltages during a transition from DRAM standby mode to either DRAM read, write, or refresh mode using n-sensing sense amplifier driver circuit 300 (FIG. 3) in accordance with the invention. In particular, voltage versus time graphs 400 include ACT output signal 402 of n-sensing sense amplifier driver circuit 300 and digital line voltage signal DL 404 at digital line DL 116 (FIG. 1). Graphs 400 also include voltage signals /RNL 212 and /DL 216 which are about the same as the corresponding signals shown in FIG. 2 and described in connection with known DRAM circuit 100 (FIG. 1). Control signals WL1, EQ, NSA, and /PSA used in connection with circuit 300 (FIG. 3) are also about the same as the corresponding signals shown in FIG. 2 and described in connection with known DRAM circuit 100 and are therefore not shown in FIG. 4 for purposes of clarity.

Referring to FIGS. 3 and 4 and various portions of FIGS. 1 and 2, n-sensing sense amplifier driver circuit 300 maintains ACT line 302 at about ground during standby mode (i.e., prior to an EQ line 332 transition from digital "1" 232 to digital "0"). In particular, control signal /PSA 206 holds /PSA line 314 at digital "1" 236 during standby mode. Digital "1" /PSA line 314 maintains transistor 304 "OFF." EQ control signal 202 holds EQ line 332 at digital "1" 232 during standby mode. Digital "1" EQ line 332 maintains transistor 306 "OFF" and maintains transistor 310 "ON." "ON" transistor 310 pulls-down ACT line 302 to about ground. As previously described, maintaining ACT line 302 at ground during standby mode (i.e., a "bleeder sense amplifier driver" circuit configuration) advantageously limits the parasitic effects of a short-circuit between a word line and a digital line of a DRAM circuit. Control signal NSA 208 holds NSA line 336 at digital "0" during standby mode, thus maintaining transistor 308 "ON" during standby mode. Because transistor 306 is "OFF" and transistor 310 is "ON," source terminal 338 and drain terminal 324 of transistor 308 are maintained at about ground.

N-sensing sense amplifier driver circuit 300 advantageously charges ACT line 302 to voltage DVC2 in response to a transition from standby mode to read, write, or refresh mode. In particular, as previously described, standby mode ends with an EQ line 332 transition from digital "1" 232 to digital "0." /PSA line 314 remains at digital "1" 236 and thus transistor 304 remains "OFF." Digital "0" EQ line 332 turns "OFF" transistor 310 and turns "ON" transistor 306. Because NSA line 336 remains at digital "0," transistor 308 remains "ON," and thus ACT line 302 is charged to voltage DVC2 through "ON" transistors 306 and 308.

ACT line 302 is preferably charged to voltage DVC2 at or before about the time when word line WL1 112 begins to switch from digital "0" to digital "1" 244. In particular, as previously described, the word line WL1 112 transition to digital "1" 244 causes a differential voltage of about $\Delta V_1$ to develop between digital lines DL 116 and /DL 122 (for capacitor 114 (FIG. 1) storing a digital "1"), thus causing a low $V_{tp}$ PMOS transistor 158 to turn "sub-threshold ON." "Sub-threshold ON" transistor 158 provides a current path between digital line DL 116 and ACT line 302. However, because n-sensing sense amplifier driver circuit 300 preferably charges ACT line 302 to voltage DVC2 at or before the time that word line WL1 112 begins to switch to digital "1" 244, "sub-threshold ON" PMOS transistor 158 has an advantageously reduced drain to source voltage when the differential voltage of about $\Delta V_1$ develops between digital lines DL 116 and /DL 122 (i.e., reduced in comparison to that caused by known sense amplifier driver circuitry 108). Therefore, reduced sub-threshold current flows through transistor 158 from digital line DL 116 (FIG. 1) to ACT line 302, thus desirably maintaining the differential voltage between digital lines DL 116 and /DL 122 closer to about $\Delta V_1$. As shown in FIG. 4, the differential voltage of about $\Delta V_1$ between DL 404 and /DL 216 is only reduced to about $\Delta V_2$, using n-sensing sense amplifier driver circuit 300 (which is greater than a differential voltage of about $\Delta V_2$, which is realized using known sense amplifier driver circuitry 108).

N-sensing sense amplifier driver circuit 300 causes sense amplifier 106 to be fully activated (i.e., fully amplifying) by reduced time $T_{3'}$ (i.e., reduced in comparison to time $T_3$ caused by known sense amplifier driver circuitry 108). In particular, NSA line 336 switches to digital "1" 236, thus causing transistor 308 to turn "OFF." /PSA line 314 switches to digital "0," thus causing transistor 304 to turn "ON." "ON" transistor 304 charges ACT line 302 to voltage $V_{CC}$ (which as previously described, in conjunction with an /RNL line 132 transition to ground, causes sense amplifier 106 to be fully activated). Because n-sensing sense amplifier driver circuit 300 pre-charges ACT line 302 to voltage DVC2, as previously described, transistor 304 more quickly charges ACT line 302 to voltage $V_{CC}$ and thus sense amplifier 106 is fully activated by reduced time $T_{3'}$.

N-sensing sense amplifier driver circuit 300 causes sense amplifier 106 (FIG. 1) to amplify the differential voltage of about $\Delta V_{2'}$ between digital lines DL 116 and /DL 122 (FIG. 1) to full digital logic separation $\Delta V_f$ by reduced time $T_{2'}$ (i.e., reduced in comparison to time $T_2$ caused by known sense amplifier driver circuitry 108). First, because n-sensing sense amplifier driver circuit 300 pre-charges ACT line 302 to voltage DVC2 and therefore causes sense amplifier 106 to be fully activated by reduced time $T_{3'}$ as previously described, sense amplifier 106 more quickly amplifies the differential voltage of about $\Delta V_{2'}$ 412 between digital lines DL 116 and /DL 122 to full digital logic separation $\Delta V_f$. Second, because n-sensing sense amplifier driver circuit 300 causes reduced sub-threshold current conduction by low $V_{tp}$ PMOS transistor 158 (which causes the differential voltage to be maintained closer to $\Delta V_1$), a higher gate to source voltage of transistor 164 is maintained that causes sense amplifier 106 to more quickly amplify the differential voltage of about $\Delta V_{2'}$ between digital lines DL 116 and /DL 122 to full digital logic separation $\Delta V_f$. Third, a differential voltage maintained closer to $\Delta V_1$ requires less amplification (and therefore time) by sense amplifier 106 to reach full digital logic separation $\Delta V_f$ between digital lines DL 116 and /DL 122.

N-sensing sense amplifier driver circuit 300 results in a more efficient power use by sense amplifier 106 (in comparison to that by known sense amplifier driver circuitry 108). In particular, because n-sensing sense amplifier driver circuit 300 causes less sub-threshold current loss through a low $V_{tp}$ PMOS transistor 158, sense amplifier 106 expends less power to recover differential voltage lost (i.e., about $(\Delta V_1 - \Delta V_{2'})$) because of sub-threshold current loss through a low $V_{tp}$ PMOS transistor 158. N-sensing sense amplifier driver circuit 300 also provides an advantageously reduced probability of an erroneous DRAM read or refresh operation (i.e., reduced in comparison to that provided by known sense amplifier driver circuitry 108). In particular, because n-sensing sense amplifier driver circuit 300 causes reduced loss of differential voltage (i.e., about $\Delta V_1$ reduced to only about $\Delta V_{2'}$) between digital lines DL 116 and /DL 122, it is less likely that an erroneous DRAM read or refresh operation will occur.

Figure 5:
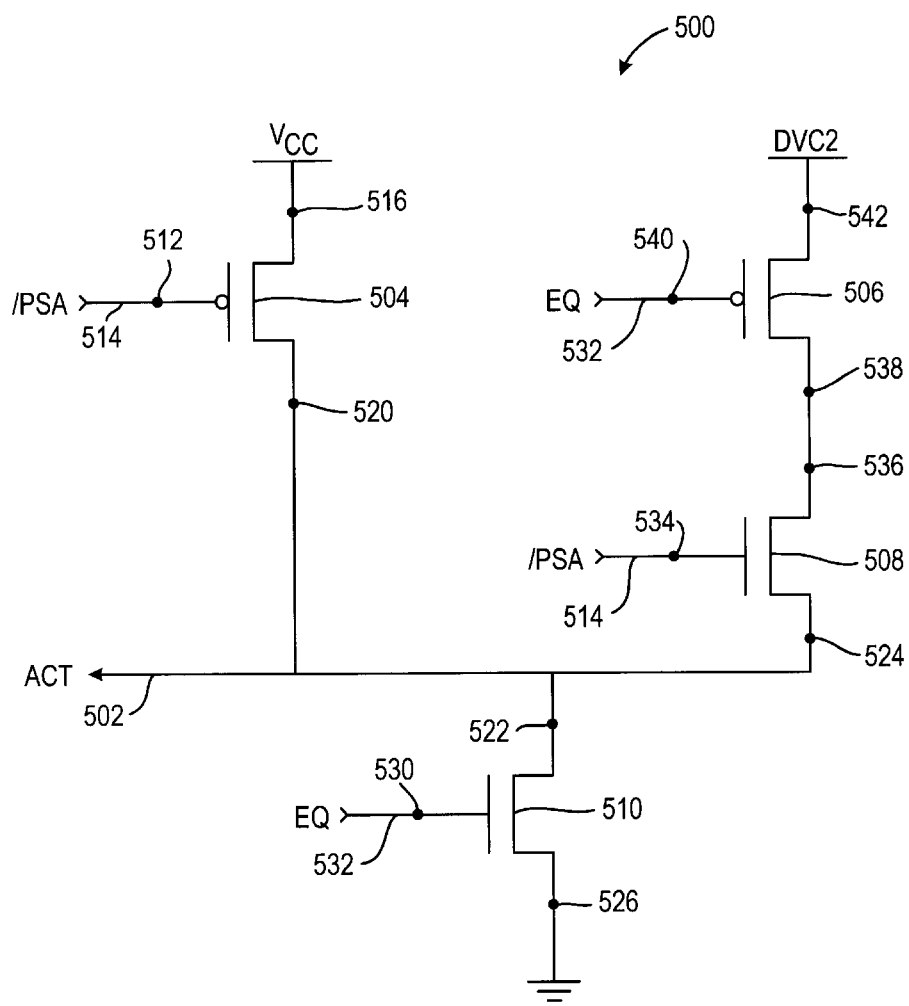
FIG. 5 is a circuit diagram of an exemplary embodiment of a p-sensing sense amplifier driver circuit in accordance with the invention.

FIG. 5 shows an exemplary p-sensing sense amplifier driver circuit 500 for outputting to ACT line 502 an ACT voltage in accordance with the invention. For a p-sensing sense amplifier driver circuit, control signal /PSA causes /PSA line to switch to digital "0" slightly before (e.g., 50 picoseconds before) control signal NSA causes NSA line to switch to digital "1" (which causes ACT line to begin to switch to voltage $V_{CC}$ slightly before /RNL line begins to switch to ground).

P-sensing sense amplifier driver circuit 500 includes PMOS transistors 504 and 506 and NMOS transistors 508 and 510. Gate terminal 512 of transistor 504 is connected to /PSA line 514 (to which a /PSA control signal is input). Source terminal 516 of transistor 504 is connected to supply voltage $V_{CC}$. Drain terminal 520 of transistor 504 is connected to both drain terminal 522 of transistor 510 and source terminal 524 of transistor 508 at ACT line 502 (to which an ACT signal is output). Source terminal 526 of transistor 510 is connected to ground. Gate terminal 530 of transistor 510 is connected to EQ line 532 (to which an EQ control signal is input). Gate terminal 534 of transistor 508 is connected to /PSA line 514. Drain terminal 536 of transistor 508 is connected to drain terminal 538 of transistor 506. Gate terminal 540 of transistor 506 is connected to EQ line 532. Source terminal 542 of transistor 506 is connected to supply voltage DVC2.

Voltage versus time graphs for control signals WL1 and EQ for a transition from DRAM standby mode to DRAM read, write, or refresh mode using a p-sensing sense amplifier driver circuit configuration are about the same as the corresponding graphs shown in FIG. 2 and are thus not shown for clarity. Additionally, voltage versus time graphs for control signals NSA and /PSA and node voltages ACT, /RNL, DL, and /DL for a transition from standby mode read, write, or refresh mode using a p-sensing sense amplifier driver circuit configuration will be apparent to one of ordinary skill in the art based on the control signals and node voltages for an n-sensing configuration shown in FIG. 2 and the associated description herein. Therefore, such voltage versus time graphs showing control signals NSA, /PSA, and node voltages ACT, /RNL, DL, and /DL are not shown.

Referring to FIGS. 3 and 5, p-sensing sense amplifier driver circuit 500 is similar to n-sensing sense amplifier driver circuit 300. It differs from n-sensing sense amplifier driver circuit 300 in that PMOS transistor 308 having gate terminal 334 connected to NSA line 336 is replaced with NMOS transistor 508 having gate terminal 534 connected to /PSA line 514.

Referring to FIGS. 1 and 5, operation of p-sensing sense amplifier 500 will be described herein in connection with various portions of known DRAM circuit 100. In particular, p-sensing sense amplifier driver circuit 500 replaces sense amplifier driver circuitry 108. Accordingly, ACT line 502 corresponds to ACT line 130, /PSA line 514 corresponds to /PSA line 126, and EQ line 532 corresponds to EQ line 124. However, p-sensing sense amplifier driver circuit 500 may be used with any suitable DRAM circuitry and is not limited to use with the various portions of known DRAM circuit 100 described herein.

P-sensing sense amplifier driver circuit 500 operates similarly to n-sensing sense amplifier driver circuit 300 (FIG. 3). First, p-sensing sense amplifier driver circuit 500 is a "bleeder" circuit that maintains ACT line 502 at about ground during DRAM standby mode. In particular, digital "1" EQ line 532 causes transistor 510 to pull-down ACT line 502 to about ground.

Additionally, p-sensing sense amplifier driver circuit 500 raises ACT line 502 to voltage DVC2 in response to a transition from DRAM standby mode to DRAM read, write, or refresh mode. In particular, digital "0" EQ line 532 turns transistor 510 "OFF" and causes transistor 506 to charge ACT line 502 to voltage DVC2 through "ON" transistor 508.

Furthermore, p-sensing sense amplifier driver circuit 500 raises ACT line 502 to voltage $V_{CC}$ 518 following development of a differential voltage between a digital lines DL 116 and /DL 122 (FIG. 1). In particular, digital "0" /PSA line 514 turns transistor 508 "OFF" and causes transistor 504 to pull-up ACT line 502 from about voltage DVC2 to voltage $V_{CC}$.

Therefore, similar to n-sensing sense amplifier driver circuitry 300 (FIG. 3), p-sensing sense amplifier driver circuitry 500 reduces sub-threshold current loss through a low $V_{tp}$ PMOS transistor 158 (FIG. 1) of sense amplifier 106 (i.e., in comparison to that caused by known sense amplifier driver circuitry 108). As previously described, reduced sub-threshold current loss through a low $V_{tp}$ PMOS transistor 158 causes sense amplifier 106 to amplify a differential voltage between digital lines DL 116 and /DL 122 to a full digital logic separation in less time and to more efficiently expend power. Additionally, because p-sensing sense amplifier driver circuitry 500 pre-charges ACT line 502 to voltage DVC2, p-sensing sense amplifier driver circuit 500 activates sense amplifier 106 in less time. Furthermore, p-sensing sense amplifier driver circuitry 500 provides a reduced probability that sense amplifier 106 will perform an erroneous DRAM read or refresh operation.

Figure 6:
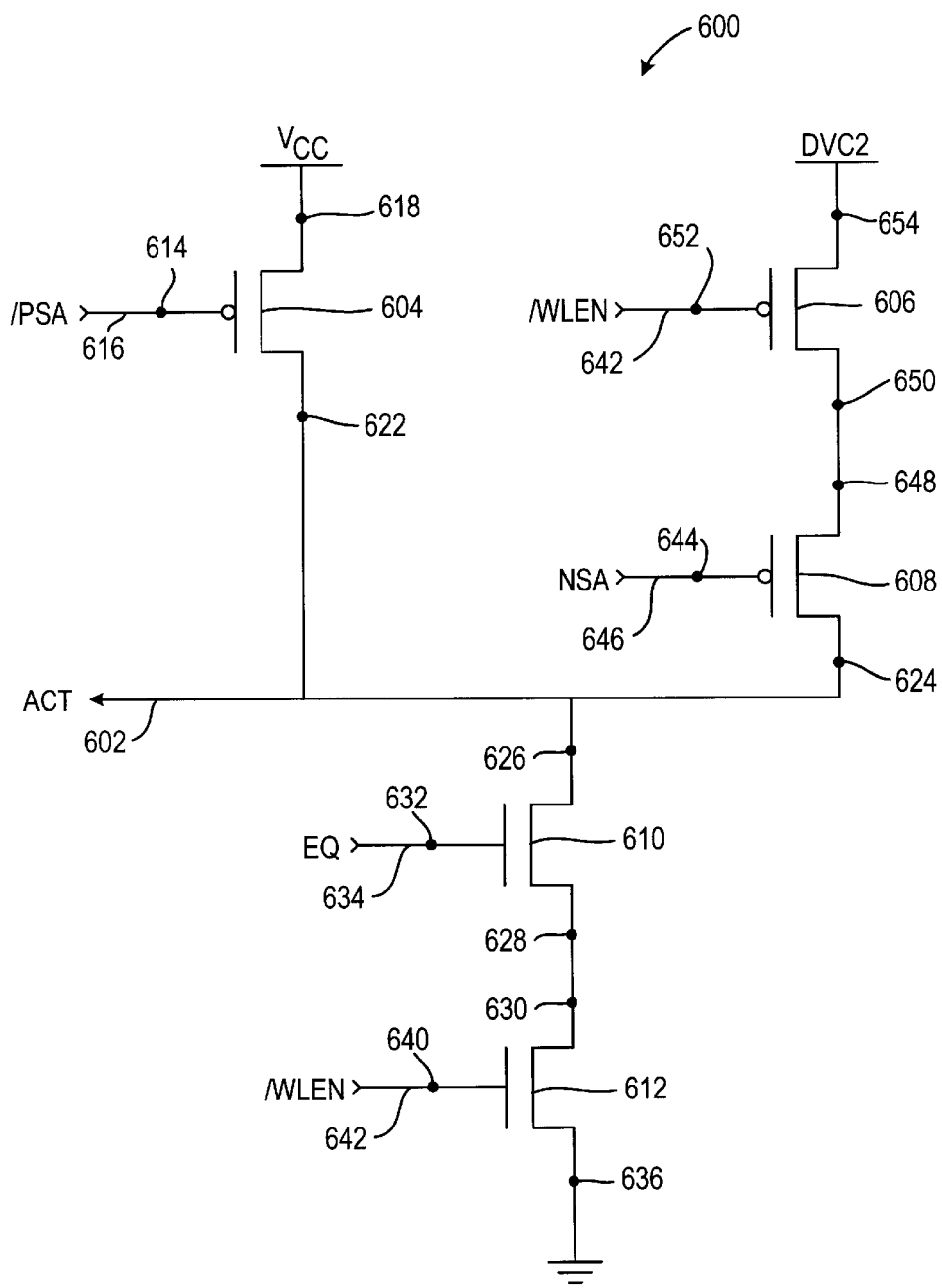
FIG. 6 is a circuit diagram of another exemplary embodiment of an n-sensing sense amplifier driver circuit in accordance with the invention.

FIG. 6 shows another exemplary embodiment of an improved n-sensing sense amplifier driver circuit 600 that outputs an ACT voltage signal to ACT line 602 in accordance with the invention. N-sensing sense amplifier driver circuit 600 includes PMOS transistors 604, 606, and 608 and NMOS transistors 610 and 612. Gate terminal 614 of transistor 604 is connected to /PSA line 616 (to which a /PSA control signal is input). Source terminal 618 of transistor 604 is connected to supply voltage $V_{CC}$. Drain terminal 622 of transistor 604 is connected to both drain terminal 624 of transistor 608 and drain terminal 626 of transistor 610 at ACT line 602 (to which an ACT signal is output). Source terminal 628 of transistor 610 is connected to drain terminal 630 of transistor 612. Gate terminal 632 of transistor 610 is connected to EQ line 634 (to which an EQ control signal is input). Source terminal 636 of transistor 612 is connected to ground. Gate terminal 640 of transistor 612 is connected to /WLEN line 642 (to which a /WLEN control signal is input). Gate terminal 644 of transistor 608 is connected to NSA line 646 (to which an NSA control signal is input). Source terminal 648 of transistor 608 is connected to drain terminal 650 of transistor 606. Gate terminal 652 of transistor 606 is connected to /WLEN line 642. Source terminal 654 of transistor 606 is connected to supply voltage DVC2.

Referring to both FIGS. 3 and 6, n-sensing sense amplifier driver circuit 600 is similar to n-sensing sense amplifier driver circuit 300. It differs from n-sensing sense amplifier driver circuit 300 in that circuit 600 includes an additional transistor 612 having gate terminal 640 connected to /WLEN line 642 between transistor 610 and ground and replaces EQ line 332 connected to NMOS transistor 306 with /WLEN line 642 connected to NMOS transistor 606.

Referring to FIGS. 1 and 6, operation of n-sensing sense amplifier 600 will be described herein in connection with various portions of known DRAM circuit 100. In particular, n-sensing sense amplifier driver circuit 600 replaces sense amplifier driver circuitry 108 of known DRAM circuit 100. Accordingly, ACT line 602 corresponds to ACT line 130, /PSA line 616 corresponds to /PSA line 126, and EQ line 634 corresponds to EQ line 124. However, n-sensing sense amplifier driver circuit 600 may be used with any suitable DRAM circuitry and is not limited to use with the various portions of known DRAM circuit 100 described herein.

Figure 7:
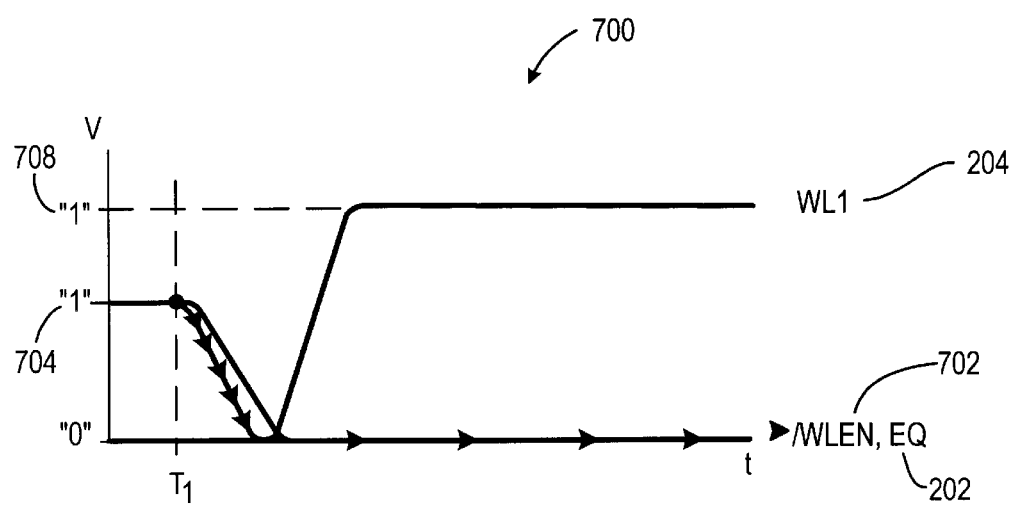
FIG. 7 shows voltage versus time graphs for various control signals of a known DRAM circuit for a transition from DRAM standby mode to either DRAM read, write, or refresh mode.

FIG. 7 shows voltage versus time graphs 700 for various control signals of a known DRAM circuit for a transition from DRAM standby mode to DRAM read, write, or refresh mode. In particular, voltage versus time graphs 700 includes control signals /WLEN 702, EQ 202, and WL1 204. Control signals EQ 202 and WL1 204 are the same as the corresponding control signals shown in FIG. 2.

Referring to both FIGS. 6 and 7, /WLEN control signal 702 causes /WLEN line 642 to begin switching from digital "1" 704 to digital "0" at about the same time that control signal EQ 202 causes EQ line 634 to begin switching from digital "1" 704 to digital "0" (which, as previously described, marks the end of DRAM standby mode). /WLEN control signal 702 is a word line enable control signal that causes signal WL1 204 (and therefore word line WL1 112 (FIG. 1)) to transition to digital "1" 708 (which, as previously described, causes a differential voltage to develop between digital lines DL 116 and /DL 122 (FIG. 1)). As shown, /WLEN line 642 completes the transition to digital "0" before EQ line 634 completes the transition to digital "0."

N-sensing sense amplifier driver circuit 600 operates similarly to both n-sensing sense amplifier driver circuit 300 (FIG. 3) and p-sensing sense amplifier driver circuit 500 (FIG. 5). Voltage versus time graphs for control signals NSA and /PSA and node voltages ACT, /RNL, DL, and /DL for a transition from DRAM standby mode to DRAM read, write, or refresh mode using n-sensing sense amplifier driver circuit 600 are about the same as the corresponding graphs shown in FIGS. 2 and 4 and described in connection with n-sensing sense amplifier driver circuit 300 and are therefore not included.

N-sensing sense amplifier driver circuit 600 maintains ACT line 602 at ground during DRAM standby mode. In particular, digital "1" EQ line 634 and digital "1" /WLEN line 642 cause transistors 610 and 612 to pull-down ACT line 602 to ground during standby mode.

Additionally, n-sensing sense amplifier driver circuit 600 raises ACT line 602 to voltage DVC2 in response to a transition from standby mode to read, write, or refresh mode. In particular, digital "0" EQ line 634 turns transistor 610 "OFF." Digital "0" /WLEN line 642 turns transistor 612 "OFF" and causes transistor 606 to charge ACT line 602 to voltage DVC2 (through "ON" transistor 608).

N-sensing sense amplifier driver circuit 600 reduces "overlap" current flowing from voltage DVC2 to ground (through transistors 606, 608, 610, 612) during charging of ACT line 602 from ground to voltage DVC2 (i.e., reduced in comparison to the "overlap" current caused by n-sensing sense amplifier driver circuit 300 (FIG. 3)). "Overlap" current flows through two simultaneously conducting transistors coupled in series (e.g., either directly electrically connected or coupled via, for example, a transistor) while the first transistor is turning "OFF," the second transistor is turning "ON," and there exists a current path between the first and second transistor (e.g., a direct electrical connection or for, example, a current path through an "ON" transistor). In particular, because /WLEN line 642 switches to digital "0" more quickly than EQ line 632 switches to digital "0," as previously described, less overlap current flows from voltage supply DVC2 to ground through transistor 606 (which is turning "ON") and transistor 612 (which is turning "OFF") when transistors 606 and 612 are simultaneously conducting current (i.e., when control signal /WLEN 702 is between $V_{tn}$ of transistor 612 and $|V_{tp}|$ of transistor 606) and transistors 608 and 610 are in the "ON" state. Therefore, n-sensing sense amplifier driver circuit 600 may be particularly useful in DRAM circuits (e.g., DRAM circuit 100) in which the EQ control signal transition time is significantly greater than the /WLEN control signal transition time (e.g., when EQ control signal 202 drives multiple installations of equalization and pre-charge circuitry 104 for multiple pairs of complimentary digital lines DL 116 and /DL 122 (FIG. 1)).

N-sensing sense amplifier driver circuit 600 also raises ACT line 602 to voltage $V_{CC}$ following development of a differential voltage between digital lines DL 116 and /DL 122 (FIG. 1). In particular, digital "1" NSA line 646 turns "OFF" transistor 608 and digital "0" /PSA line 616 causes transistor 604 to pull-up ACT line 602 from about voltage DVC2 to voltage $V_{CC}$.

Therefore, similar to n-sensing sense amplifier driver circuit 300 (FIG. 3) and p-sensing sense amplifier driver circuit 500 (FIG. 5), n-sensing sense amplifier driver circuitry 600 reduces sub-threshold current loss through a low $V_{tp}$ PMOS transistor 158 (FIG. 1) of sense amplifier 106 (i.e., reduced in comparison to that caused by known sense amplifier driver circuitry 108 (FIG. 1)). Additionally, n-sensing sense amplifier driver circuitry 600 activates sense amplifier 106 in less time, causes sense amplifier 106 to amplify a differential voltage between digital lines DL 116 and /DL 122 to a full digital logic separation in less time, and causes sense amplifier 106 to more efficiently expend power. Furthermore, n-sensing sense amplifier driver circuitry 600 reduces the probability that sense amplifier 106 will perform an erroneous DRAM read or refresh operation.

Figure 8:
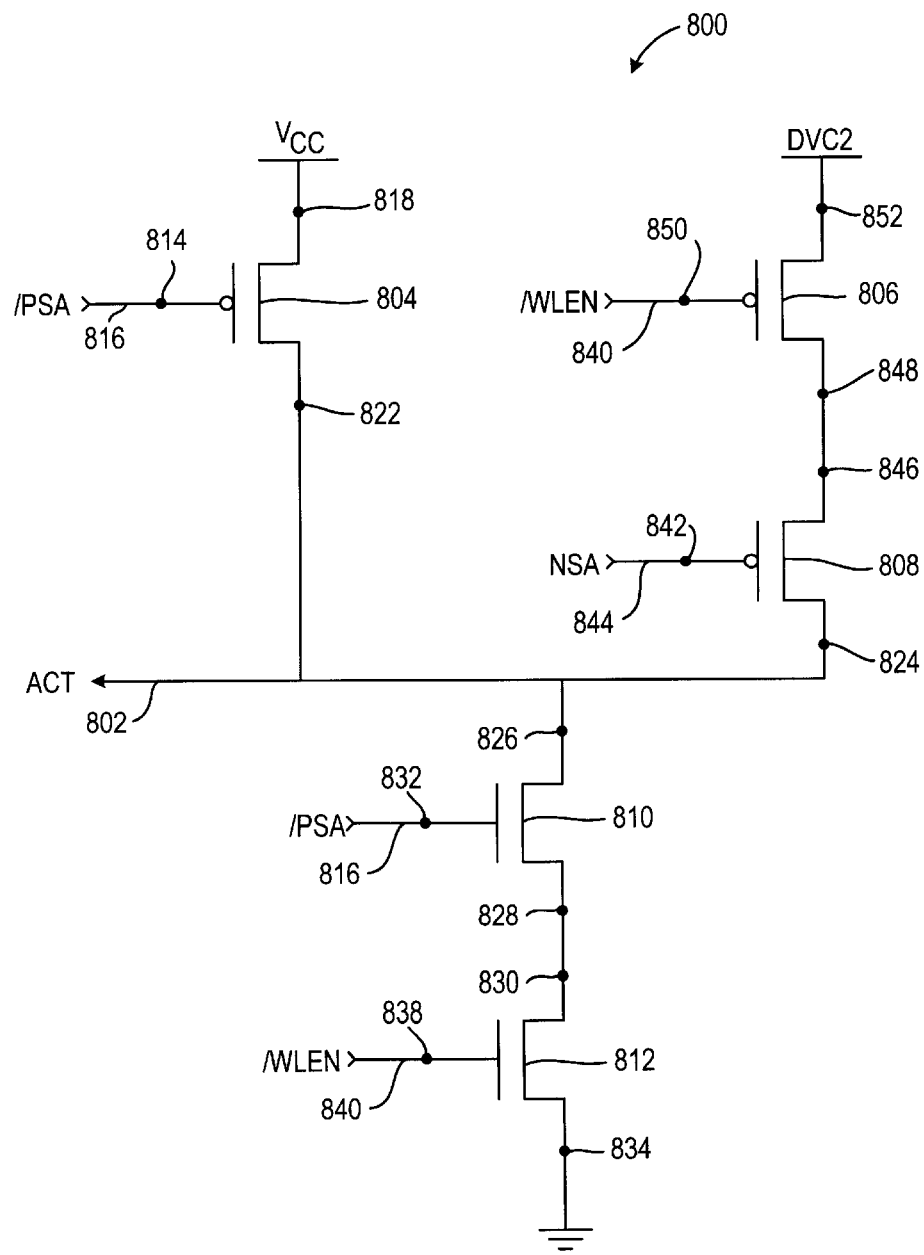
FIG. 8 is a circuit diagram of still another exemplary embodiment of an n-sensing sense amplifier driver circuit in accordance with the invention.

FIG. 8 shows still another exemplary embodiment of an n-sensing sense amplifier driver circuit 800 that outputs to ACT line 802 an ACT voltage signal in accordance with the invention. N-sensing sense amplifier driver circuit 800 includes PMOS transistors 804, 806, and 808 and NMOS transistors 810 and 812. Gate terminal 814 of transistor 804 is connected to /PSA line 816 (to which a /PSA control signal is input). Source terminal 818 of transistor 804 is connected to supply voltage $V_{CC}$. Drain terminal 822 of transistor 804 is connected to both drain terminal 824 of transistor 808 and drain terminal 826 of transistor 810 at ACT line 802 (to which an ACT signal is output). Source terminal 828 of transistor 810 is connected to drain terminal 830 of transistor 812. Gate terminal 832 of transistor 810 is connected to /PSA line 816. Source terminal 834 of transistor 812 is connected to ground 836. Gate terminal 838 of transistor 812 is connected to /WLEN line 840 (to which a /WLEN control signal is input). Gate terminal 842 of transistor 808 is connected to NSA line 844 (to which an NSA control signal is input). Source terminal 846 of transistor 808 is connected to drain terminal 848 of transistor 806. Gate terminal 850 of transistor 806 is connected to /WLEN line 840. Source terminal 852 of transistor 806 is connected to supply voltage DVC2.

Referring to both FIGS. 6 and 8, n-sensing sense amplifier driver circuit 800 is similar to n-sensing sense amplifier driver circuit 600 (FIG. 6). In particular, circuit 800 replaces EQ line 634 connected to NMOS transistor 610 with /PSA line 816 connected to NMOS transistor 810.

Referring to both FIGS. 1 and 8, operation of n-sensing sense amplifier 800 will be described herein in connection with various portions of known DRAM circuit 100. In particular, n-sensing sense amplifier driver circuit 800 replaces sense amplifier driver circuitry 108 of known DRAM circuit 100. Accordingly, ACT line 802 corresponds to ACT line 130, /PSA line 816 corresponds to /PSA line 126, and NSA line 844 corresponds to NSA line 128. However, n-sensing sense amplifier driver circuit 800 may be used with any suitable DRAM circuitry and is not limited to use with the various portions of known DRAM circuit 100 described herein.

N-sensing sense amplifier driver circuit 800 operates similarly to both n-sensing sense amplifier driver circuits 300 (FIG. 3) and 600 (FIG. 6) and p-sensing sense amplifier driver circuit 500 (FIG. 5). Voltage versus time graphs for control signals WL1, EQ, NSA, and /PSA and node voltages ACT, /RNL, DL, and /DL for a transition from DRAM standby mode to DRAM read, write, or refresh mode using n-sensing sense amplifier driver circuit 800 are about the same as the corresponding graphs shown in FIGS. 2 and 4 and described in connection with operation of n-sensing sense amplifier driver circuit 300 and are thus not shown.

N-sensing sense amplifier driver circuit 800 maintains ACT line 802 at about ground during DRAM standby mode. In particular, digital "1" /WLEN line 840 causes transistor 812 to pull-down ACT line 802 to about ground through "ON" transistor 810.

Additionally, n-sensing sense amplifier driver circuit 800 raises ACT line 802 to voltage DVC2 in response to a transition from standby mode to read, write, or refresh mode. In particular, digital "0" /WLEN line 840 turns transistor 812 "OFF" and causes transistor 806 to pull-up ACT line 802 to voltage s DVC2 through "ON" transistor 808. Similar to n-sensing sense amplifier driver circuit 600 (FIG. 6), n-sensing sense amplifier driver circuit 800 reduces "overlap" current flowing from voltage DVC2 to ground (through transistors 806, 808, 810, and 812) during charging of ACT line 802 from ground to voltage DVC2 (i.e., in comparison to the "overlap" current caused by n-sensing sense amplifier driver circuit 300 (FIG. 3)). Because n-sensing sense amplifier driver circuit 800 uses the voltage of /PSA line 816 and not EQ line 634 (FIG. 6) to turn "OFF" and "ON" transistor 810, n-sensing sense amplifier driver circuit 800 advantageously reduces the load of EQ line 124 (FIG. 1), thus reducing the time required for EQ line 124 to switch to digital "0" (i.e., reduced in comparison to that realized using known sense amplifier driver circuitry 108 (FIG. 1), and sense amplifier driver circuits 300 (FIG. 3), 500 (FIG. 5), and 600 (FIG. 6)). Therefore, n-sensing sense amplifier driver circuitry 800 increases the time margin between EQ line 124 reaching digital "0" and word line WL1 112 (FIG. 1) reaching digital "1," thus advantageously reducing the probability that EQ line 124 and WL1 112 are simultaneously switching digital states (which can cause erroneous DRAM read and refresh operations).

Furthermore, n-sensing sense amplifier driver circuit 800 raises ACT line 802 to voltage $V_{CC}$ following development of a differential voltage between digital lines DL 116 and /DL 122 (FIG. 1). In particular, digital "1" NSA line 844 turns transistor 808 "OFF" and digital "0" /PSA line 816 causes transistor 804 to pull-up ACT line 802 from about voltage DVC2 to voltage $V_{CC}$.

Thus, n-sensing sense amplifier driver circuit 800 reduces sub-threshold current loss through a low $V_{tp}$ PMOS transistor 158 of sense amplifier 106 (i.e., in comparison to that caused by known sense amplifier driver circuitry 108 (FIG. 1)). Additionally, n-sensing sense amplifier driver circuit 800 activates sense amplifier 106 in reduced time, causes sense amplifier 106 to amplify a differential voltage between digital lines DL 116 and /DL 122 to a full digital logic separation in reduced time, and causes sense amplifier 106 to more efficiently expend power. Furthermore, n-sensing sense amplifier driver circuit 800 reduces the probability that sense amplifier 106 will perform an erroneous DRAM read or refresh operation.

Figure 9:
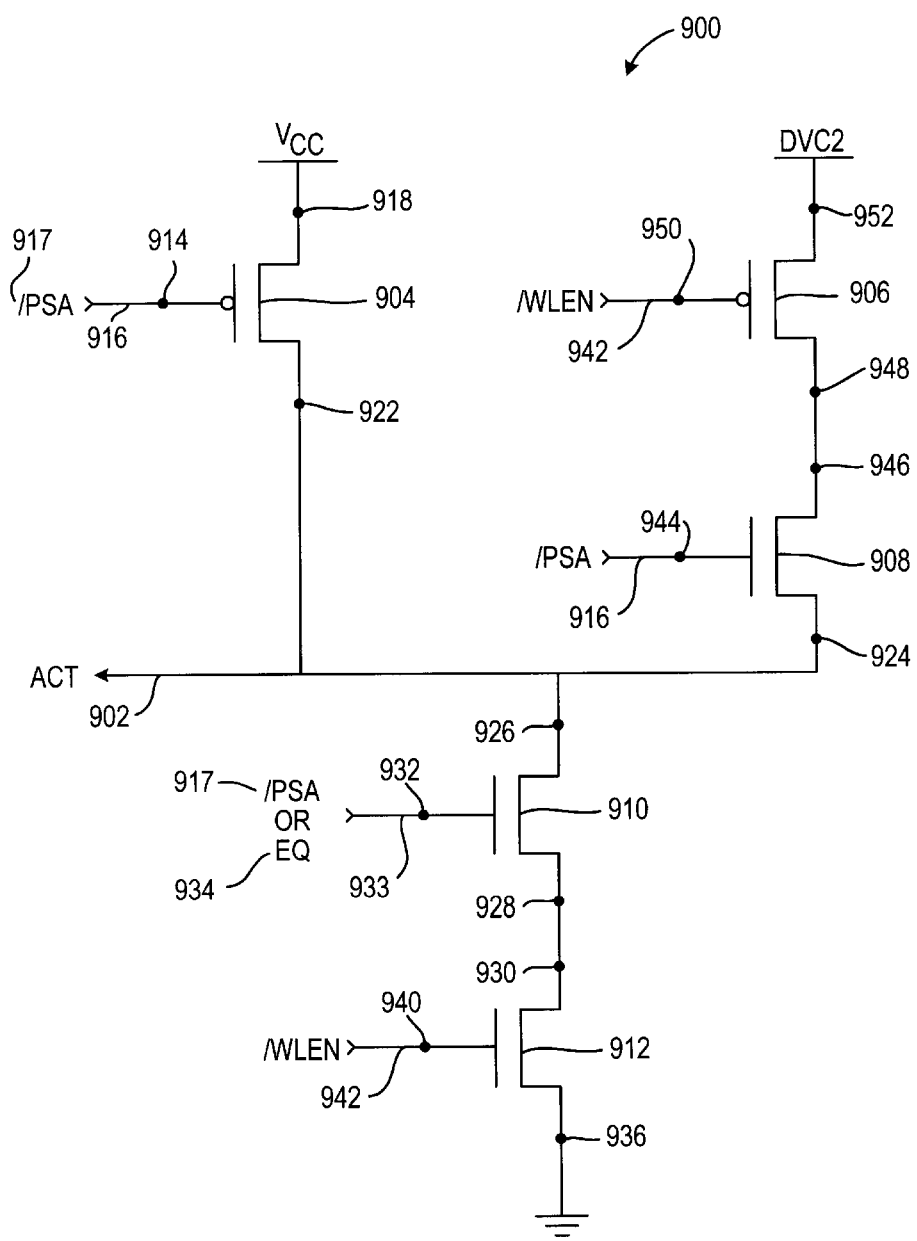
FIG. 9 is a circuit diagram of another exemplary embodiment of a p-sensing sense amplifier driver circuit in accordance with the invention.

FIG. 9 shows another exemplary embodiment of a p-sensing sense amplifier driver circuit 900 for outputting an ACT voltage to ACT line 902 in accordance with the invention. P-sensing sense amplifier driver circuit 900 includes PMOS transistors 904 and 906 and NMOS transistors 908, 910, and 912. Gate terminal 914 of transistor 904 is connected to /PSA line 916 (to which /PSA control signal 917 is input). Source terminal 918 of transistor 904 is connected to supply voltage $V_{CC}$. Drain terminal 922 of transistor 904 is connected to both source terminal 924 of transistor 908 and drain terminal 926 of transistor 910 at ACT line 902 (to which an ACT signal is output). Source terminal 928 of transistor 910 is connected to drain terminal 930 of transistor 912. Gate terminal 932 of transistor 910 is connected to control line 933. Control line 933 can be /PSA line 916 or the EQ line to which EQ control signal 934 is input. Source terminal 936 of transistor 912 is connected to ground. Gate terminal 940 of transistor 912 is connected to /WLEN line 942 (to which a /WLEN control signal is input). Gate terminal 944 of transistor 908 is connected to /PSA line 916. Drain terminal 946 of transistor 908 is connected to drain terminal 948 of transistor 906. Gate terminal 950 of transistor 906 is connected to /WLEN line 942. Source terminal 952 of transistor 906 is connected to supply voltage DVC2.

Referring to FIGS. 6, 8, and 9, p-sensing sense amplifier driver circuit 900 is similar to n-sensing sense amplifier driver circuits 600 and 800. However, when gate terminal 932 of transistor 910 is connected to /PSA line 916, circuit 900 differs from circuit 800 in that PMOS transistor 808 having gate terminal 842 connected to NSA line 844 is replaced with NMOS transistor 908 having gate terminal 944 connected to /PSA line 916. Similarly, when gate terminal 932 of transistor 910 is connected to the EQ line to which control signal EQ 934 is input, circuit 900 differs from circuit 600 in that PMOS transistor 608 having gate terminal 644 connected to NSA line 646 is replaced with NMOS transistor 908 having gate terminal 944 connected to /PSA line 916.

Referring to both FIGS. 1 and 9, operation of p-sensing sense amplifier driver circuit 900 is described herein in connection with various portions of known DRAM circuit 100. In particular, p-sensing sense amplifier driver circuit 900 replaces sense amplifier driver circuitry 108 of known DRAM circuit 100. Accordingly, ACT line 902 corresponds to ACT line 130, /PSA line 916 corresponds to /PSA line 126, and the EQ line to which control signal EQ 934 is input corresponds to EQ line 124. However, p-sensing sense amplifier driver circuit 900 may be used with any suitable DRAM circuitry and is not limited to operation with the various portions of known DRAM circuit 100 described herein.

P-sensing sense amplifier driver circuit 900 operates similarly to n-sensing sense amplifier driver circuits 600 (FIG. 6) and 800 (FIG. 8). First, p-sensing sense amplifier driver circuit 900 maintains ACT line 902 at about ground during DRAM standby mode. In particular, digital "1" /WLEN 942 causes transistor 912 to pull-down ACT line 902 to about ground through "ON" transistor 910 during DRAM standby mode. Transistor 910 can maintained "ON" by digital "1" /PSA line 916 or digital "1" EQ 934 (of the corresponding EQ line) during DRAM standby mode.

Additionally, p-sensing sense amplifier driver circuit 900 raises ACT line 902 to voltage DVC2 in response to a transition from DRAM standby mode to DRAM read, write, or refresh mode. In particular, digital "0" /WLEN line 942 turns transistor 912 "OFF" and causes transistor 906 to pull-up ACT line 902 to voltage DVC2 (through "ON" transistor 908). Similar to n-sensing sense amplifier driver circuits 600 (FIG. 6) and 800 (FIG. 8), circuit 900 reduces "overlap" current flowing from supply voltage DVC2 to ground (through transistors 906, 908, 910, and 912) during charging of ACT line 902 from ground to voltage DVC2 (i.e., in comparison to the "overlap" current caused by n-sensing sense amplifier driver circuit 300 (FIG. 3)). When gate terminal 932 of transistor 910 is connected to /PSA line 916 (and not the EQ line to which control signal EQ 934 is input), circuit 900 advantageously increases the time margin between EQ line 124 (FIG. 1) reaching digital "0" and word line WL1 112 reaching digital "1," thus reducing the probability that EQ line 124 and WL1 112 are simultaneously switching digital states (which can cause erroneous DRAM read and refresh operations).

Furthermore, p-sensing sense amplifier driver circuit 900 raises ACT line 902 to voltage $V_{CC}$ following development of a differential voltage between a digital lines DL 116 and /DL 122 (FIG. 1). In particular, digital "0" /PSA line 916 turns transistor 908 "OFF" and causes transistor 904 to pull-up ACT line 902 from about voltage DVC2 to voltage $V_{CC}$.

Thus, p-sensing sense amplifier driver circuit 900 causes reduced sub-threshold current loss through a low $V_{tp}$ PMOS transistor 158 of sense amplifier 106 (i.e., reduced in comparison to that caused by known sense amplifier driver circuitry 108). Additionally, p-sensing sense amplifier driver circuit 900 activates sense amplifier 106 in reduced time, causes sense amplifier 106 to amplify a differential voltage between digital lines DL 116 and /DL to a full digital logic separation in reduced time, and causes sense amplifier 106 to more efficiently expend power. Furthermore, p-sensing sense amplifier driver circuit 900 reduces the probability that sense amplifier 106 will perform an erroneous DRAM read or refresh operation.

In accordance with the invention, improved circuits for outputting an RNL voltage signal to an RNL line are also provided (i.e., improved in comparison to known sense amplifier driver circuitry 110 (FIG. 1)). As previously described, EQ line 124 (FIG. 1) turns "OFF" and "ON" transistor 148 of known sense amplifier driver circuitry 110. This EQ loading may be undesirable when, for example, it causes EQ line 124 and WL1 112 to be simultaneously switching digital states (which, as previously described, can cause an erroneous DRAM read or refresh operation).

Figure 10:
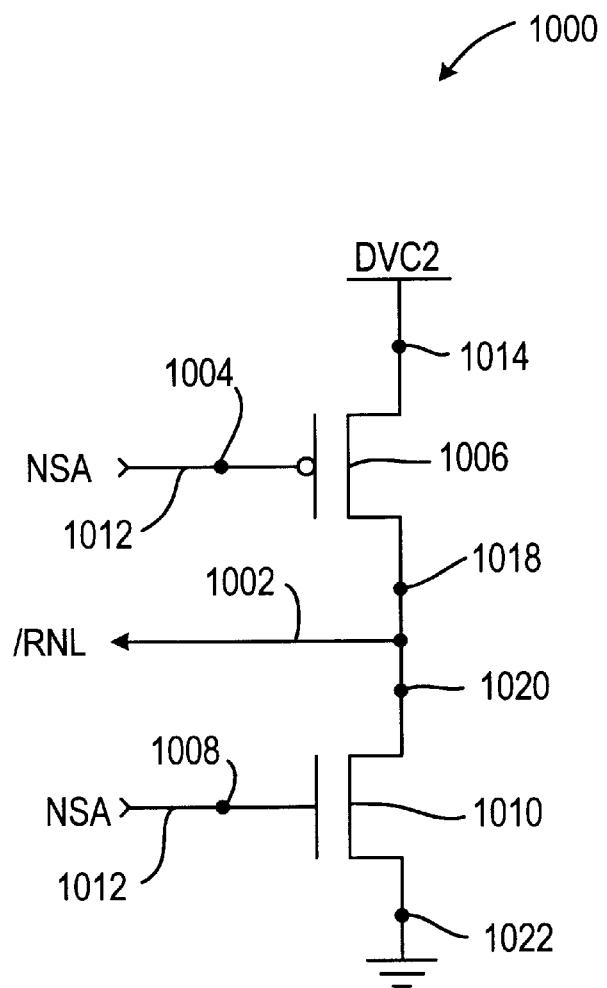
FIG. 10 is a circuit diagram of an exemplary embodiment of a sense amplifier driver circuit in accordance with the invention.

FIG. 10 shows an exemplary embodiment of sense amplifier driver circuit 1000 for outputting an /RNL voltage signal to /RNL line 1002 in accordance with the invention. Sense amplifier driver circuit 1000 is a CMOS inverter. In particular, both gate terminal 1004 of PMOS transistor 1006 and gate terminal 1008 of NMOS transistor 1010 are connected to NSA line 1012. Source terminal 1014 of transistor 1006 is connected to supply voltage DVC2. Drain terminal 1018 of transistor 1006 is connected to drain terminal 1020 of transistor 1010 at /RNL line 1002. Source terminal 1022 of transistor 1010 is connected to ground.

As shown, NSA line 1012 turns "OFF" and "ON" transistor 1006 of sense amplifier driver circuit 1000. Thus, sense amplifier driver circuit 1000 reduces EQ loading in comparison to known sense amplifier driver circuitry 110 (FIG. 1).

Referring to both FIGS. 1 and 10, operation of sense amplifier driver circuitry 1000 is described in connection with various portions of known DRAM circuit 100. In particular, sense amplifier driver circuit 1000 replaces sense amplifier driver circuitry 110 of known DRAM circuit 100. Accordingly, /RNL line 1002 corresponds to /RNL line 132 and NSA line 1012 corresponds to NSA line 128. However, sense amplifier driver circuit 1000 may be used with any suitable DRAM circuitry and is not limited to use with the various portions of known DRAM circuit 100 described herein.

Voltage versus time graphs for control signals and node voltages for a transition from DRAM standby mode to DRAM read, write, or refresh mode using sense amplifier driver circuit 1000 are about the same as graphs 200 (FIG. 2; e.g., EQ control signal 202 may switch to digital "0" 202 more quickly using circuit 1000) and thus such graphs are not shown again.

Referring to FIGS. 1, 2 and 10, sense amplifier driver circuit 1000 pulls-down /RNL line 1002 to about ground during DRAM read, write, or refresh mode (which, in conjunction with ACT line 130, which is pushed-up to voltage $V_{CC}$, causes sense amplifier 106 to be fully activated). In particular, referring to FIG. 2, an NSA line 1012 transition to digital "1" 236 turns transistor 1006 "OFF" and causes transistor 1010 to pull-down /RNL line 1002 to about ground. Because the control signal NSA 208 causes NSA line 1024 to switch digital states relatively quickly, overlap current through transistors 1006 and 1010 of circuit 1000 during an NSA line 1012 transition is limited.

Figure 11:
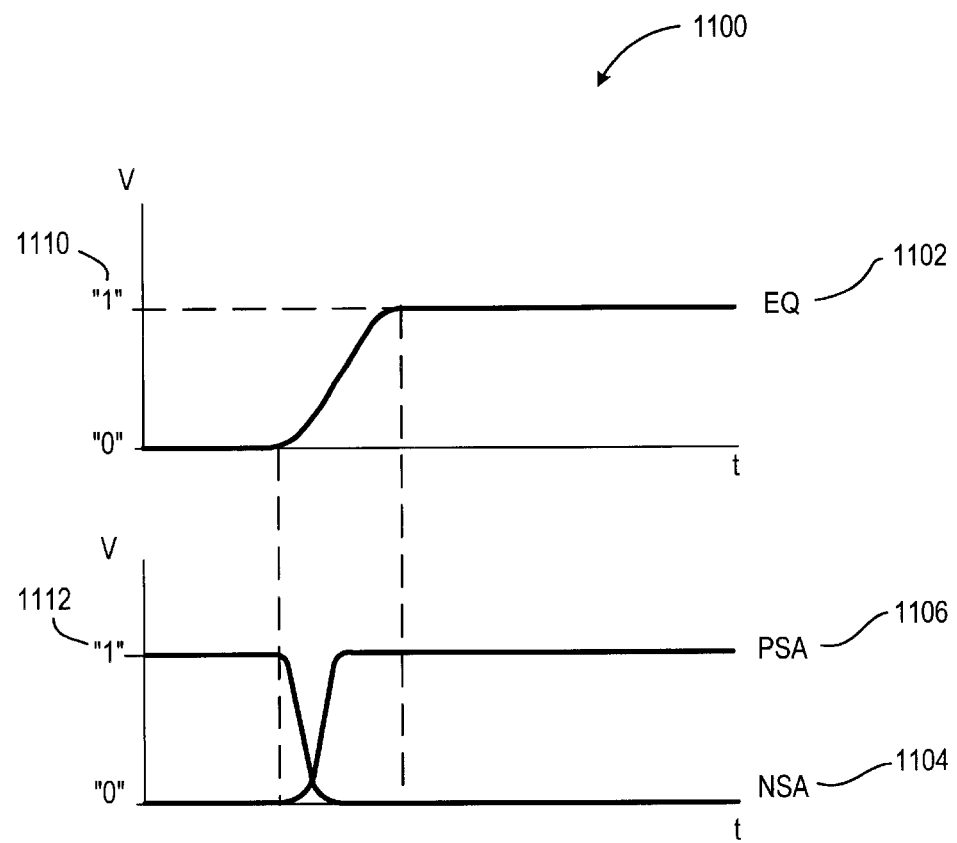
FIG. 11 shows voltage versus time graphs for various control signals of a known DRAM circuit for a transition from either DRAM read, write, or refresh mode to DRAM standby mode.

FIG. 11 shows voltage versus time graphs 1100 for various control signals of a known DRAM circuit for a transition from DRAM read, write, or refresh mode to DRAM standby mode. In particular, voltage versus time graphs 1100 include control signals EQ 1102, NSA 1104, and /PSA 1106. As shown, EQ control signal 1102 switches from digital "0" to digital "1" 1110, NSA control signal 1104 switches from digital "1" 1112 to digital "0," and /PSA control signal switches from digital "0" to digital "1" 1112 for a transition from read, write, or refresh mode to standby mode. Each of control signals EQ 1102, NSA 1104, and /PSA 1106 begins to switch at about the same time (NSA switches slightly before /PSA in an n-sensing configuration). However, control signal NSA 1104 completes the transition to digital "0" and control signal /PSA 1106 completes the transition to digital "1" 1112 before control signal EQ 1102 completes the transition to digital "1" 1110 (i.e., because control signal EQ 1102 is generally more heavily loaded than control signals NSA 1104 and /PSA 1106).

Referring to FIGS. 10 and 11, sense amplifier driver circuit 1000 pushes-up /RNL line 1002 to voltage DVC2 in response to a transition from DRAM read, write, or refresh mode to DRAM standby mode. In particular, a transition of NSA control signal 1104 to digital "0" causes transistor 1010 to turn "OFF" and transistor 1006 to pull-up /RNL line 1002 to voltage DVC2.

Sense amplifier driver circuit 1000 provides additional advantages when used in connection with n-sensing sense amplifier driver circuit 300 (FIG. 3) and p-sensing sense amplifier driver circuit 500 (FIG. 5). In particular, when used in connection with circuits 300 and 500, sense amplifier driver circuit 1000 reduces power consumption by a DRAM circuit during a transition from DRAM read, write, or refresh mode to DRAM standby mode. In particular, referring to FIGS. 3, 10, and 11, because control signal EQ 1102 causes transistor 306 to turn "OFF" and because EQ control signal 1102 switches more slowly than control signals NSA 1104 and /PSA 1106, as previously described, there exists a current path from ACT line 302 to supply voltage DVC2 (through "ON" transistors 306 and 308) when control signal NSA 1104 completes the transition to digital "0." Current (that supplements the current sourced by DVC2) flows from ACT line 302 (which is at about voltage $V_{CC}$ when read, write, or refresh mode ends) through supply voltage DVC2 to charge /RNL line 1002 (which is at about ground when read, write, or refresh mode ends). Put simply, ACT line 302 and /RNL line 1002 (FIG. 10) are "charge-shared" until control signal EQ 1102 causes transistor 306 to turn "OFF." Therefore, /RNL line 1002 is charged to DVC2 in reduced time, thus reducing power loss through transistors 162 and 164 (FIG. 1) during equalization of digital lines DL 116 and 122 (i.e., prior to /RNL 1002 line reaching DVC2, transistors 162 and 164 may be "ON," thus causing current to flow from digital lines DL 116 and /DL 122 to /RNL line 1002).

Similarly, referring to FIGS. 5, 10, and 11, because control signal EQ 1102 causes transistor 506 to turn "OFF" and because control signal EQ 1102 switches more slowly than control signals NSA 1104 and /PSA 1106, as previously described, a current path exists from ACT line 502 to supply voltage DVC2 (through "ON" transistors 506 and 508) when control signal NSA 1104 completes the transition to digital "0." Current (that supplements the current sourced by DVC2) flows from ACT line 502 (which is at about voltage $V_{CC}$ when read, write, or refresh mode ends) through supply voltage DVC2 to charge /RNL line 1002 (which is at about ground when read, write, or refresh mode ends). Put simply, ACT line 502 (FIG. 5) and /RNL line 1002 (FIG. 10) are "charge-shared" until control signal EQ 1102 causes transistor 506 to turn "OFF." Therefore, /RNL line 1002 is charged to DVC2 in reduced time, thus reducing power loss through transistors 162 and 164 (FIG. 1) during equalization of digital lines DL 116 and 122 (FIG. 1).

Figure 12:
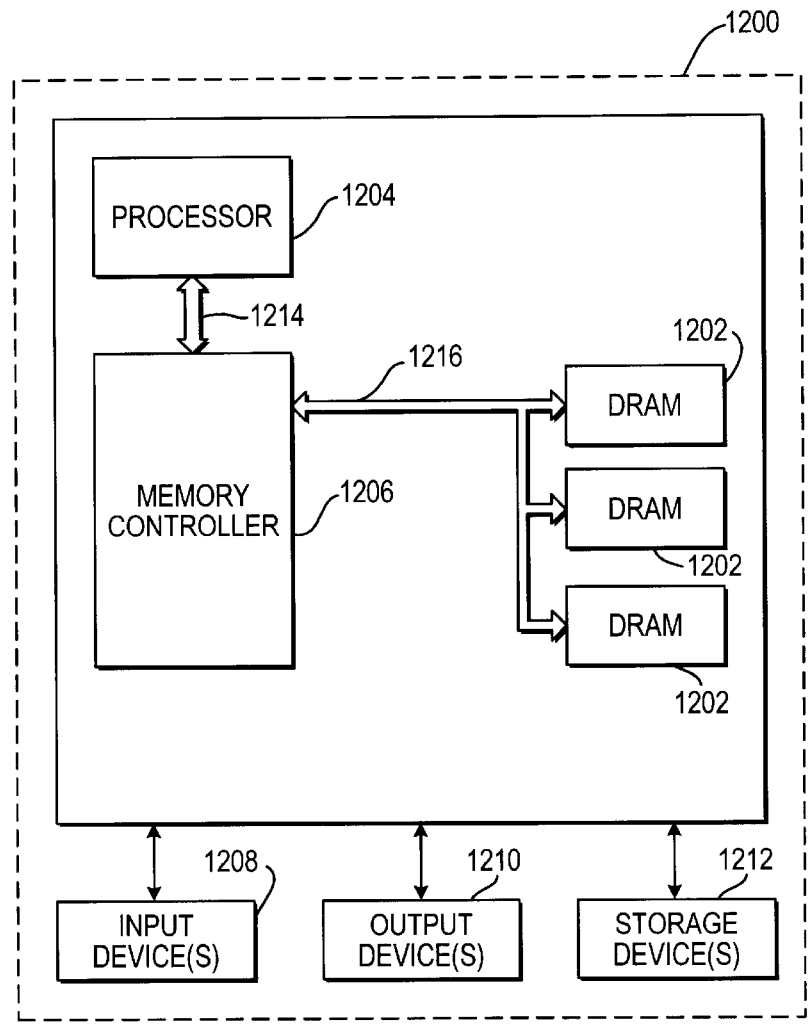
FIG. 12 is a block diagram of a system that incorporates the invention.

FIG. 12 shows a system that incorporates the invention. System 1200 includes a plurality of DRAM chips 1202, a processor 1204, a memory controller 1206, input devices 1208, output devices 1210, and optional storage devices 1212. DRAM chips 1202 include an array of memory cells, sense amplifier circuitry, and sense amplifier driver circuitry in accordance with the invention (e.g., sense amplifier driver circuitry of FIGS. 3, 5, 6, 8, 9 or 10). DRAM chips 1202 may also include various other DRAM peripheral circuitry (e.g., equalization and pre-charge circuitry).

Data and control signals are transferred between processor 1204 and memory controller 1206 via bus 1214. Similarly, data and control signals are transferred between memory controller 1206 and DRAM chips 1202 via bus 1216. Input devices 1208 can include, for example, a keyboard, a mouse, a touch-pad display screen, or any other appropriate device that allows a user to enter information into system 1200. Output devices 1210 can include, for example, a video display unit, a printer, or any other appropriate device capable of providing output data to a user. Note that input devices 1208 and output devices 1210 can alternatively be a single input/output device. Storage devices 1212 can include, for example, one or more disk or tape drives.

Thus it is seen that improved circuits and methods for driving a DRAM sense amplifier having low threshold voltage PMOS transistors are provided. One skilled in the art will appreciate that the invention can be practiced by other than the described embodiments, which are presented for purposes of illustration and not of limitation, and the invention is limited only by the claims which follow.

I claim:

1. An electrical circuit for driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor, said circuit comprising:
  a switch coupled between a voltage source and a source terminal of said PMOS transistor, said switch operative to raise said source terminal to a voltage greater than ground potential in response to a transition from DRAM standby mode to one of DRAM read mode, DRAM write mode, and DRAM refresh mode and prior to development of a differential voltage between a gate terminal and a drain terminal of said PMOS transistor.

2. The electrical circuit of claim 1 wherein said PMOS transistor comprises a low threshold voltage ($V_{tp}$) PMOS transistor.

3. The electrical circuit of claim 1 wherein said switch comprises at least one transistor operative to raise said source terminal to said voltage greater than said ground potential in response to receiving a voltage transition on a control line indicating the end of DRAM standby mode.

4. An electrical circuit for driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor, said circuit comprising:
  at least one transistor operative to maintain a source terminal of said PMOS transistor at about ground potential during DRAM standby mode; and
  a switch coupled between a voltage source and said source terminal, said switch operative to raise said source terminal to a voltage greater than said ground potential in response to a transition from said DRAM standby mode to one of DRAM read mode, DRAM write mode, and DRAM refresh mode and prior to development of a differential voltage between a gate terminal and a drain terminal of said PMOS transistor.

5. The electrical circuit of claim 4 wherein said PMOS transistor comprises a low threshold voltage ($V_{tp}$) PMOS transistor.

6. The electrical circuit of claim 5 wherein said $V_{tp}$ is slightly greater than said differential voltage.

7. The electrical circuit of claim 6 wherein said differential voltage between said gate terminal and said drain terminal causes said low $V_{tp}$ PMOS transistor to turn "sub-threshold ON."

8. The electrical circuit of claim 4 wherein said at least one transistor maintains said source terminal at about ground potential in response to receiving a voltage transition on a control line indicating DRAM standby mode.

9. The electrical circuit of claim 4 wherein said at least one transistor comprises two transistors operative to pull-down said source terminal to about ground potential in response to voltage transitions on both an EQ line and a /WLEN line to digital "1."

10. The electrical circuit of claim 4 wherein said at least one transistor comprises two transistors operative to pull-down said source terminal to about ground potential in response to voltage transitions on both a /PSA line and a /WLEN line to digital "1."

11. The electrical circuit of claim 4 wherein said switch comprises at least one transistor operative to raise said source terminal to said voltage greater than said ground potential in response to receiving a voltage transition on a control line indicating the end of DRAM standby mode.

12. The electrical circuit of claim 11 wherein said voltage transition comprises a transition to digital "0."

13. The electrical circuit of claim 4 wherein said switch comprises at least one transistor operative to raise said source terminal to said voltage greater than said ground potential in response to a voltage transition on a /WLEN line to digital "0."

14. An electrical circuit for driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor and an n-type metal oxide semiconductor (NMOS) field-effect transistor, said circuit comprising:
  first circuitry operative to maintain a source terminal of said PMOS transistor at ground potential during DRAM standby mode;
  second circuitry operative to raise said source terminal to an intermediate voltage in response to a transition from said DRAM standby mode to one of DRAM read mode, DRAM write mode, and DRAM refresh mode and prior to development of a differential voltage between a gate terminal and a drain terminal of said PMOS transistor; and
  third circuitry operative to raise said source terminal to a full supply voltage after said differential voltage develops between said gate terminal and said drain terminal, wherein:
    said intermediate voltage is about one-half of said full supply voltage.

15. The electrical circuit of claim 14 wherein said third circuitry comprises at least one transistor operative to raise said source terminal to said full supply voltage in response to a voltage transition on a /PSA line to digital "0."

16. The electrical circuit of claim 14 wherein said third circuitry causes said DRAM sense amplifier to be fully activated.

17. The electrical circuit of claim 14 wherein said third circuitry causes said DRAM sense amplifier to amplify said differential voltage to a full digital logic separation.

18. The electrical circuit of claim 14 further comprising fourth circuitry operative to:
  pull-down a source terminal of said NMOS transistor to about ground potential after said differential voltage develops between said gate terminal and said drain terminal of said PMOS transistor and during said one of said DRAM read mode, said DRAM write mode, and said DRAM refresh mode; and
  raise said source terminal of said NMOS transistor to said intermediate voltage in response to a transition from said one of said DRAM read mode, said DRAM write mode, and said DRAM refresh mode to said DRAM standby mode.

19. The electrical circuit of claim 18 wherein said fourth circuitry comprises two transistors operative to pull-down said source terminal of said NMOS transistor to said ground potential in response to a voltage transition on an NSA line to digital "1" and to raise said source terminal of said NMOS transistor to said intermediate voltage in response to a voltage transition on said NSA line to digital "0."

20. An electrical circuit for driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor, said circuit comprising:

a first switch operative to raise a source terminal of said PMOS transistor to a first voltage in response to a signal indicating the end of DRAM standby mode and prior to development of a differential voltage between a gate terminal and a drain terminal of said PMOS transistor; and a second switch operative to raise said source terminal of said PMOS transistor to a second voltage after said differential voltage develops, wherein:

said first voltage is less than said second voltage.

21. An electrical circuit for driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor, said circuit comprising:

circuitry operative to maintain a source terminal of said PMOS transistor at ground potential during DRAM standby mode;

circuitry operative to raise said source terminal to an intermediate voltage in response to a voltage transition on a /WLEN line to digital "0" and prior to development of a differential voltage between a gate terminal and a drain terminal of said PMOS transistor; and circuitry operative to raise said source terminal of said PMOS transistor to a full supply voltage after said differential voltage develops, wherein:

said intermediate voltage is about one-half of said full supply voltage.

22. An electrical circuit for driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor, said circuit comprising:

circuitry operative to maintain a source terminal of said PMOS transistor at ground potential prior to a voltage transition on an EQ line to digital "0;"

circuitry operative to raise said source terminal to an intermediate voltage in response to said voltage transition on said EQ line to said digital "0" and prior to development of a differential voltage between a gate terminal and a drain terminal of said PMOS transistor; and circuitry operative to raise said source terminal of said PMOS transistor to a full supply voltage after said differential voltage develops and in response to a voltage transition on a PSA line to digital "0," wherein:

said intermediate voltage is about one-half of said full supply voltage.

23. An electrical circuit for driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor, said circuit comprising:

circuitry operative to maintain a source terminal of said PMOS transistor at ground potential prior to a voltage transition on an EQ line to digital "0;"

circuitry operative to raise said source terminal to an intermediate voltage in response to a voltage transition on a /WLEN line to digital "0" and prior to development of a differential voltage between a gate terminal and a drain terminal of said PMOS transistor; and circuitry operative to raise said source terminal of said PMOS transistor to a full supply voltage after said differential voltage develops and in response to a voltage transition on a /PSA line to digital "0," wherein:

said intermediate voltage is about one-half of said full supply voltage.

24. An electrical circuit for driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor and an n-type metal oxide semiconductor (NMOS) field-effect transistor, said circuit comprising:

a PMOS transistor having a source terminal, a gate terminal, and a drain terminal, said source terminal of said PMOS transistor maintained at a voltage greater than ground potential, said gate terminal of said PMOS transistor operative to receive a control signal, and said drain terminal of said PMOS transistor coupled to a source terminal of said CMOS inverter PMOS transistor, wherein:

said PMOS transistor is operative to raise said source terminal of said CMOS inverter PMOS transistor to said voltage greater than ground potential in response to receiving said control signal having a voltage transition from one digital state to the other and prior to development of a differential voltage between a gate terminal and a drain terminal of said CMOS inverter PMOS transistor.

25. The electrical circuit of claim 24 wherein said drain terminal of said PMOS transistor is coupled to said source terminal of said CMOS inverter PMOS transistor via a third transistor.

26. The electrical circuit of claim 25 wherein said third transistor is a third PMOS transistor having a source terminal, a gate terminal, and a drain terminal, said source terminal of said third PMOS transistor coupled to said drain terminal of said PMOS transistor, said gate terminal of said third PMOS transistor coupled to an NSA line, and said drain terminal of said third PMOS transistor coupled to said source terminal of said CMOS inverter PMOS transistor, a voltage of said NSA line at digital "0" when said source terminal of said CMOS inverter PMOS transistor is raised to said voltage greater than ground potential.

27. The electrical circuit of claim 25 wherein said third transistor is a third NMOS transistor having a drain terminal, a gate terminal, and a source terminal, said drain terminal of said third NMOS transistor coupled to said drain terminal of said PMOS transistor, said gate terminal of said third NMOS transistor coupled to a /PSA line, and said source terminal of said third NMOS transistor coupled to said source terminal of said CMOS inverter PMOS transistor, a voltage of said /PSA line at digital "1" when said source terminal of said CMOS inverter PMOS transistor is raised to said voltage greater than ground potential.

28. An electrical circuit for driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor and an n-type metal oxide semiconductor (NMOS) field-effect transistor, said circuit comprising:

a PMOS transistor having a source terminal, a gate terminal, and a drain terminal, said source terminal of said PMOS transistor maintained at a voltage greater than ground potential, said gate terminal of said PMOS transistor coupled to a /WLEN line, and said drain terminal of said PMOS transistor coupled to a source terminal of said CMOS inverter PMOS transistor, wherein:

said PMOS transistor is operative to raise said source terminal of said CMOS inverter PMOS transistor to said voltage greater than ground potential in response to a voltage transition on said /WLEN line to digital "0" and prior to development of a differential voltage between a gate terminal and a drain terminal of said CMOS inverter PMOS transistor.

29. The electrical circuit of claim 28 wherein said drain terminal of said PMOS transistor is coupled to said source terminal of said CMOS inverter PMOS transistor via an "ON" transistor.

30. The electrical circuit of claim 29 wherein said "ON" transistor is an "ON" PMOS transistor having a source terminal, a gate terminal, and a drain terminal, said source terminal of said "ON" PMOS transistor coupled to said drain terminal of said PMOS transistor, said gate terminal of said "ON" PMOS transistor coupled to an NSA line, and said drain terminal of said "ON" PMOS transistor coupled to said source terminal of said CMOS inverter PMOS transistor, a voltage of said NSA line at digital "0" when said source terminal of said CMOS inverter PMOS transistor is raised to said voltage greater than ground potential.

31. The electrical circuit of claim 29 wherein said "ON" transistor is an "ON" NMOS transistor having a drain terminal, a gate terminal, and a source terminal, said drain terminal of said "ON" NMOS transistor coupled to said drain terminal of said PMOS transistor, said gate terminal of said "ON" NMOS transistor coupled to a /PSA line, and said source terminal of said "ON" NMOS transistor coupled to said source terminal of said CMOS inverter PMOS transistor, a voltage of said /PSA line at digital "1" when said source terminal of said CMOS inverter PMOS transistor is raised to said voltage greater than ground potential.

32. A method of driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor, said method comprising:

maintaining a source terminal of said PMOS transistor at about ground potential during DRAM standby mode; and raising the voltage at said source terminal to a voltage greater than said ground potential in response to a transition from said DRAM standby mode to one of DRAM read mode, DRAM write mode, and DRAM refresh mode and prior to development of a differential voltage between a gate terminal and a drain terminal of said PMOS transistor.

33. The method of claim 32 wherein said PMOS transistor comprises a low threshold voltage ($V_{tp}$) PMOS transistor.

34. The method of claim 33 wherein said $V_{tp}$ is slightly greater than said differential voltage.

35. The method of claim 34 wherein said differential voltage causes said low $V_{tp}$ PMOS transistor to turn "sub-threshold ON."

36. The method of claim 32 wherein said maintaining comprises:

receiving a voltage transition on a control line indicating DRAM standby mode; and pulling-down the voltage at said source terminal to about ground potential in response to said voltage transition.

37. The method of claim 32 wherein said maintaining comprises pulling-down the voltage at said source terminal to about ground potential in response to voltage transitions on both an EQ line and a /WLEN line to digital "1."

38. The method of claim 32 wherein said maintaining comprises pulling-down the voltage at said source terminal to said ground potential in response to voltage transitions on both a /PSA line and a /WLEN line to digital "1."

39. The method of claim 32 wherein said raising comprises raising the voltage at said source terminal to said voltage greater than said ground potential in response to a voltage transition on an EQ line to digital "0."

40. The method of claim 32 wherein said raising comprises raising the voltage at said source terminal to said voltage greater than said ground potential in response to a voltage transition on a /WLEN line to digital "0."

41. A method of driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor and an n-type metal oxide semiconductor (NMOS) field-effect transistor, said method comprising:

maintaining a source terminal of said PMOS transistor at about ground potential during DRAM standby mode;

raising said source terminal to an intermediate supply voltage in response to a transition from said DRAM standby mode to one of DRAM read mode, DRAM write mode, and DRAM refresh mode and prior to development of a differential voltage between a gate terminal and a drain terminal of said PMOS transistor; and raising said source terminal to a full supply voltage after said differential voltage develops, wherein:

said intermediate supply voltage is between said full supply voltage and ground potential.

42. The method of claim 41 wherein said raising said source terminal to said full supply voltage comprises raising said source terminal to said full supply voltage in response to a voltage transition on said /PSA line to digital "0."

43. The method of claim 41 wherein said raising said source terminal to said full supply voltage causes said sense amplifier to be fully activated.

44. The method of claim 41 wherein said raising said voltage of said source terminal to said full supply voltage causes said sense amplifier to amplify said differential voltage to a full digital logic separation.

45. The method of claim 41 further comprising:

pulling-down a source terminal of said NMOS transistor to about ground potential after said differential voltage develops between said gate terminal and said drain terminal of said PMOS transistor and during said one of said DRAM read mode, said DRAM write mode, and said DRAM refresh mode; and raising said source terminal of said NMOS transistor to said intermediate voltage in response to a transition from said one of said DRAM read mode, said DRAM write mode, and said DRAM refresh mode to said DRAM standby mode.

46. The method of claim 45 wherein said pulling-down comprises pulling-down said source terminal of said NMOS transistor to said ground potential in response to a voltage transition on an NSA line to digital "1."

47. The method of claim 45 wherein said raising said source terminal of said NMOS transistor to said intermediate voltage comprises raising said source terminal of said NMOS transistor to said intermediate voltage in response to an NSA line transition to digital "0."

48. A method of driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor, said method comprising:
   raising the voltage of a said source terminal of said PMOS transistor to an intermediate voltage in response to a voltage transition on a control line indicating the end of DRAM standby mode and prior to development of a differential voltage between a gate terminal and a drain terminal of said PMOS transistor; and
   raising said source terminal to a full supply voltage after said differential voltage develops, wherein:
      said intermediate voltage is less than said full supply voltage and greater than ground potential.

49. A method of driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor, said method comprising:
   maintaining a source terminal of said PMOS transistor at ground potential during DRAM standby mode;
   raising the voltage of said source terminal to a first voltage in response to a voltage transition on a /WLEN line and prior to development of a differential voltage between a gate terminal and a drain terminal of said PMOS transistor; and
   raising the voltage of said source terminal of said PMOS transistor to a second voltage after said differential voltage develops, wherein said first voltage is less than said second voltage.

50. A method of driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor, said method comprising:
   raising the voltage of a source terminal of said PMOS transistor to a first voltage in response to a voltage transition on an EQ line and prior to development of a differential voltage between a gate terminal and a drain terminal of said PMOS transistor; and
   raising the voltage of said source terminal of said PMOS transistor to a second voltage after said differential voltage develops and in response to a voltage transition on a PSA line, wherein:
      said first voltage is less than said second voltage.

51. A method of driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor, said method comprising:
   raising the voltage of a source terminal of said PMOS transistor to a first voltage in response to said DRAM leaving standby mode and prior to development of a differential voltage between a gate terminal and a drain terminal of said PMOS transistor; and
   raising the voltage of said source terminal of said PMOS transistor from said first voltage to a second voltage after said differential voltage develops.

52. A dynamic random access memory (DRAM) circuit comprising:
   a complimentary pair of digital lines including a first digital line and a second digital line;
   a DRAM cell operative to store a digital data bit, said DRAM cell connected to said first digital line of said complimentary pair of digital lines;
   equalization and pre-charge circuitry operative to equalize and pre-charge said complimentary pair of digital lines to an intermediate voltage;
   a word line operative to select said DRAM cell to cause a differential voltage to develop between said pair of complimentary pair of digital lines;
   a sense amplifier operative to amplify said differential voltage to a full digital logic separation, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor, said PMOS transistor having a drain terminal coupled to said first digital line and a gate terminal coupled to said second digital line; and
   sense amplifier driver circuitry operative to:
      maintain a source terminal of said PMOS transistor at ground potential while said equalization and pre-charge circuitry equalizes and pre-charges said complimentary pair of digital lines;
      raise said source terminal to said intermediate voltage after said equalization and pre-charge circuitry ceases to equalize and pre-charge said complimentary pair of digital lines and prior to said word line causing said differential voltage to develop; and
      raise said source terminal to a full supply voltage after said differential voltage develops, said intermediate voltage about one-half of said full supply voltage.

53. The DRAM circuit of claim 52 wherein said word line selects said DRAM cell for one of a DRAM read, DRAM write, and DRAM refresh operation.

54. The DRAM circuit of claim 53 wherein said source terminal raised to said full supply voltage causes said sense amplifier to amplify said differential voltage to said full digital logic separation.

55. A system comprising:
   a processor;
   a memory controller;
   an input/output device;
   a dynamic random access memory chip comprising an array of memory cells, sense amplifier circuitry, and sense amplifier driver circuitry, said sense amplifier circuitry including a latch formed by cross-coupling a first complimentary metal oxide semiconductor (CMOS) inverter and a second CMOS inverter, said first CMOS inverter having a p-type metal oxide semiconductor (PMOS) field-effect transistor, said sense amplifier driver circuitry operative to raise a source terminal of said PMOS transistor to a voltage greater than ground potential in response to a transition from DRAM standby mode to one of DRAM read mode, DRAM write mode, and DRAM refresh mode and prior to development of a differential voltage between a gate terminal and a drain terminal of said PMOS transistor; and data and control signal busing coupled to said processor, to said memory controller, to said dynamic random access memory chip, and to said input/output device.

56. An electrical circuit for driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor, said circuit comprising:

means for switching a source terminal of said PMOS transistor to a voltage greater than ground potential in response to a transition from DRAM standby mode to one of DRAM read mode, DRAM write mode, and DRAM refresh mode and prior to development of a differential voltage between a gate terminal and a drain terminal of said PMOS transistor.

57. An electrical circuit for driving a dynamic random access memory (DRAM) sense amplifier, said sense amplifier including a latch formed by cross-coupling a first complimentary metal oxide semiconductor (CMOS) inverter and a second CMOS inverter, said first CMOS inverter having a p-type metal oxide semiconductor (PMOS) field-effect transistor, said circuit comprising:

means for maintaining a source terminal of said PMOS transistor at about ground potential during DRAM standby mode; and means for raising the voltage at said source terminal to a voltage greater than said ground potential in response to a transition from said DRAM standby mode to one of DRAM read mode, DRAM write mode, and DRAM refresh mode and prior to development of a differential voltage between a gate terminal and a drain terminal of said PMOS transistor.

* * * * *

UNITED STATES PATENT AND TRADEMARK OFFICE
CERTIFICATE OF CORRECTION

PATENT NO. : 6,728,151 B2
DATED : April 27, 2004
INVENTOR(S) : Yangsung Joo

It is certified that error appears in the above-identified patent and that said Letters Patent is hereby corrected as shown below:

Column 4,
Line 34, change "RAM" to -- DRAM --.

Column 5,
Line 45, change "non" to -- "0" --.

Column 12,
Line 55, change "or for, example," to -- or, for example, --.

Column 14,
Line 24, delete "s" between "voltage" and "DVC2".

Signed and Sealed this

Twenty-eighth Day of December, 2004

JON W. DUDAS
*Director of the United States Patent and Trademark Office*